United States Patent
Takahashi et al.

(10) Patent No.: US 11,152,472 B2
(45) Date of Patent: Oct. 19, 2021

(54) CRYSTALLINE OXIDE SEMICONDUCTOR

(71) Applicants: FLOSFIA INC., Kyoto (JP); DENSO CORPORATION, Kariya (JP)

(72) Inventors: Isao Takahashi, Kyoto (JP); Tatsuya Toriyama, Kyoto (JP); Masahiro Sugimoto, Kyoto (JP); Takashi Shinohe, Kyoto (JP); Hideyuki Uehigashi, Kariya (JP); Junji Ohara, Kariya (JP); Fusao Hirose, Kariya (JP); Hideo Matsuki, Kariya (JP)

(73) Assignees: FLOSFIA INC., Kyoto (JP); DENSO CORPORATION, Kariya (JP)

( * ) Notice: Subject to any disclaimer, the term of this patent is extended or adjusted under 35 U.S.C. 154(b) by 15 days.

(21) Appl. No.: 16/724,494

(22) Filed: Dec. 23, 2019

(65) Prior Publication Data

US 2020/0212184 A1    Jul. 2, 2020

(30) Foreign Application Priority Data

Dec. 26, 2018    (JP) .............................. JP2018-242290

(51) Int. Cl.
*H01L 29/24*    (2006.01)
*H01L 21/02*    (2006.01)
(Continued)

(52) U.S. Cl.
CPC .......... *H01L 29/24* (2013.01); *C23C 16/4481* (2013.01); *H01L 21/0262* (2013.01);
(Continued)

(58) Field of Classification Search
CPC ............... H01L 29/24; H01L 21/02565; H01L 21/0262; H01L 23/367; H01L 29/045;
(Continued)

(56) References Cited

U.S. PATENT DOCUMENTS 9,711,590 B2    7/2017  Kaneko et al.
10,202,685 B2   2/2019  Oda et al.
(Continued)

FOREIGN PATENT DOCUMENTS

EP    3 291 284       3/2018
JP    2010-516599     5/2010
(Continued)

OTHER PUBLICATIONS

Extended European Search Report dated Apr. 9, 2020 in corresponding European Patent Application No. 19219247.4.
(Continued)

*Primary Examiner* — Sheikh Maruf
(74) *Attorney, Agent, or Firm* — Wenderoth, Lind & Ponack, L.L.P.

(57) ABSTRACT

A crystalline oxide semiconductor with excellent crystalline qualities that is useful for semiconductors requiring heat dissipation is provided. A crystalline oxide semiconductor including a first crystal axis, a second crystal axis, a first side, and a second side that is shorter than the first side, a linear thermal expansion coefficient of the first crystal axis is smaller than a linear thermal expansion coefficient of the second crystal axis, a direction of the first side is parallel and/or substantially parallel to a direction of the first crystal axis, and a direction of the second side is parallel and/or substantially parallel to a direction of the second crystal axis.

16 Claims, 14 Drawing Sheets

(51) Int. Cl.
| | |
|---|---|
| *C23C 16/448* | (2006.01) |
| *H01L 23/367* | (2006.01) |
| *H01L 29/04* | (2006.01) |
| *H01L 29/739* | (2006.01) |
| *H01L 29/778* | (2006.01) |
| *H01L 29/78* | (2006.01) |
| *H01L 29/808* | (2006.01) |
| *H01L 29/872* | (2006.01) |
| *H01L 33/26* | (2010.01) |
| *H02M 3/335* | (2006.01) |

(52) U.S. Cl.
CPC ...... H01L 21/02565 (2013.01); H01L 23/367 (2013.01); H01L 29/045 (2013.01); H01L 29/7395 (2013.01); H01L 29/7786 (2013.01); H01L 29/7827 (2013.01); H01L 29/8083 (2013.01); H01L 29/872 (2013.01); H01L 33/26 (2013.01); *H02M 3/33569* (2013.01)

(58) Field of Classification Search
CPC ............. H01L 29/7395; H01L 29/7786; H01L 29/7827; H01L 29/8083; H01L 29/872; H01L 33/26; H01L 23/3735; H01L 23/49568; H01L 23/473; H01L 23/4334; H01L 23/49562; H01L 33/28; H01L 29/7813; H01L 29/0619; H01L 29/7787; H01L 21/02628; H01L 21/02433; H01L 21/0242; H01L 21/02414; H01L 33/642; H01L 29/7869; H01L 29/732
USPC .......................................................... 257/43
See application file for complete search history.

(56) References Cited

U.S. PATENT DOCUMENTS

| | | | | |
|---|---|---|---|---|
| 2010/0084652 A1* | 4/2010 | Yamazaki | ........... | H01L 29/1054 257/43 |
| 2011/0316143 A1* | 12/2011 | Noritake | ................. | H01L 23/34 257/713 |
| 2013/0153889 A1* | 6/2013 | Yamazaki | ......... | H01L 21/02554 257/43 |
| 2014/0217470 A1* | 8/2014 | Sasaki | ................. | H01L 29/7869 257/192 |
| 2015/0084043 A1* | 3/2015 | Ishihara | ............ | H01L 29/66969 257/43 |
| 2015/0084047 A1* | 3/2015 | Yamazaki | ............... | H01L 29/24 257/43 |
| 2015/0187818 A1* | 7/2015 | Miyake | ............... | H01L 29/7869 257/43 |
| 2015/0221679 A1* | 8/2015 | Yamazaki | ......... | H01L 29/42384 257/43 |
| 2015/0249157 A1* | 9/2015 | Yamazaki | ......... | H01L 29/66969 257/43 |
| 2015/0255612 A1* | 9/2015 | Yamazaki | ............... | H01L 29/24 257/43 |
| 2015/0263174 A1* | 9/2015 | Yamazaki | ......... | H01L 29/66969 257/43 |
| 2015/0325659 A1* | 11/2015 | Hitora | ................. | H01L 29/8083 257/43 |
| 2015/0325660 A1* | 11/2015 | Hitora | ................. | H01L 21/0257 257/43 |
| 2015/0329371 A1* | 11/2015 | Kurosawa | ............ | C01G 15/006 361/783 |
| 2015/0372146 A1* | 12/2015 | Shishido | ........... | H01L 29/41733 257/43 |
| 2016/0035896 A1* | 2/2016 | Yamazaki | ........... | H01L 27/1259 257/43 |
| 2016/0111548 A1* | 4/2016 | Yamazaki | ........... | H01L 29/4908 257/43 |
| 2016/0190346 A1* | 6/2016 | Kawata | ............... | H01L 21/0262 257/43 |
| 2016/0192539 A1* | 6/2016 | Sugita | ................ | H05K 7/20927 361/699 |
| 2017/0022407 A1* | 1/2017 | Hatakeyama | ........... | C08K 3/28 |
| 2017/0040241 A1* | 2/2017 | Yoshida | .............. | H01L 21/4882 |
| 2017/0081579 A1* | 3/2017 | Fujikawa | ................. | C09K 5/14 |
| 2017/0278706 A1* | 9/2017 | Oda | ................. | H01L 29/66969 |
| 2018/0013356 A1* | 1/2018 | Nishibe | ................. | H02M 7/003 |
| 2018/0061952 A1* | 3/2018 | Tokuda | ................. | H01L 29/045 |
| 2018/0088656 A1* | 3/2018 | Arduini | ................... | G06F 1/305 |

FOREIGN PATENT DOCUMENTS

| | | |
|---|---|---|
| JP | 2010-232623 | 10/2010 |
| JP | 5343224 | 11/2013 |
| JP | 5397794 | 1/2014 |
| JP | 5397795 | 1/2014 |
| JP | 2014-72533 | 4/2014 |
| JP | 2016-98166 | 5/2016 |
| JP | 2016-100592 | 5/2016 |
| JP | 2016-100593 | 5/2016 |

OTHER PUBLICATIONS

Sbeta, M., et al., "Influence of the spin acceleration time on the properties of ZnO:Ga thin films deposited by sol-gel method", Journal of Sol-Gel Science and Technology, 2018, vol. 86, Issue 2, pp. 513-520.

Kazuhide Kusakabe et al., "Overgrowth of GaN Layer on GaN Nano-Columns by RF-Molecular Beam Epitaxy", Journal of Crystal Growth, 237-239, pp. 988-992 (2002).

K. Y. Zang et al., "Defect Reduction by Periodic $SiN_x$ Interlayers in Gallium Nitride Grown on Si (111)", Journal of Applied Physics 101, 093502 p. 093502-1-093502-4 (2007).

Kentaro Kaneko, "Growth and Physical Properties of Corundum-Structured Gallium Oxide Alloy Thin Films", Dissertion, Kyoto Univ., pp. 1-116 (Mar. 2013), with Abstract.

Akio Takatsuka et al., "Epitaxiyal Lateral Overgrowth of $\alpha$-$Ga_2O_3$ by Mist Epitaxy Technique", Report on the 62nd Spring Science Lecture of the Institute of Applied Physics, Tokai University, p. 16-052 (Mar. 2015), with English translation.

* cited by examiner

CRYSTALLINE OXIDE SEMICONDUCTOR

TECHNICAL FIELD

The present invention relates to a crystalline oxide semiconductor that is useful in semiconductor devices. The present invention also relates to a semiconductor device including the crystalline oxide semiconductor.

BACKGROUND ART

When growing crystals on heterogeneous substrates, there have been problems of cracks and lattice defects. To solve these problems, it has been studied to match lattice constants and thermal expansion coefficients between the substrate and the film. Further, when there are mismatches of lattice constants and thermal expansion coefficients, deposition techniques such as ELO (Epitaxial Lateral Overgrowth) and the like have been studied.

Patent Literature 1 describes a method in which a buffer layer is formed on a heterogeneous substrate and a zinc oxide based crystalline semiconductor layer is grown on the buffer layer. Patent Literature 2 describes to form a mask of nanodots on a heterogeneous substrate, and then, to form a single crystal semiconductor material layer. Non-Patent Literature 1 describes to grow a crystal of GaN on sapphire via a nanocolumn of GaN. Non-Patent Literature 2 describes a growth of GaN crystal on Si (111) using a periodic SiN intermediate layer in order to reduce defects such as pits.

However, in above-mentioned techniques, due to a low deposition rate, cracks, dislocations, warpages and the like of the substrate, dislocations, cracks and the like of the epitaxial film, it was difficult to obtain a high-quality epitaxial film. Also, it was difficult to increase a diameter of the substrate or to increase a thickness of the epitaxial film.

As a switching device of the next generation achieving high withstand voltage, low losses, and high temperature resistance, semiconductor devices using gallium oxide ($Ga_2O_3$) with a wide band gap are expected to be applied to power semiconductor devices such as an inverter. Also, gallium oxide is expected to be applied to a light emitting and receiving element such as a light emitting diode (LED) and a sensor due to its wide band gap. According to Non Patent Literature 3, such gallium oxide has a band gap that may be controlled by forming mixed crystal with indium or aluminum singly or in combination and such a mixed crystal is extremely attractive materials as InAlGaO-based semiconductors. Here, InAlGaO-based semiconductors refer to $In_xAl_YGazO_3$ ($0{\leq}X{\leq}2$, $0{\leq}Y{\leq}2$, $0{\leq}Z{\leq}2$, $X+Y+Z=1.5{\sim}2.5$) and can be regarded as the same material type containing gallium oxide.

However, since the most stable phase of gallium oxide is a β-gallium structure, it is difficult to deposit a crystalline film with a corundum structure unless using a special method of deposition, and many problems remains in crystal quality and the like. In order to solve these problems, several studies have been performed about deposition of a crystalline semiconductor having a corundum structure.

Patent Literature 3 describes a method of manufacturing a crystal oxide thin film from a bromide or iodide of gallium or indium, by using a mist CVD method. Patent Literatures 4-6 describe a multilayer structure including a corundum-structured semiconductor layer and a corundum-structured insulating layer that are formed on a corundum-structured base substrate.

In recent years, as described in Patent Literatures 7 to 9 and Non-Patent Literature 4, an ELO-growth and the like of a corundum-structured gallium oxide film has been studied. According to a method described in Patent Literatures 7 to 9, it is possible to obtain a gallium oxide film with a good quality of corundum structure. However, even with a method of ELO deposition and the like using a difference of thermal expansion coefficients described in Patent Literature 7, obtained crystal film tends to have facet structure. Also, there is a problem such as dislocations and cracks caused by the facet growth, so that it was not satisfactory to be applied to semiconductor devices.

Patent Literatures 3 to 9 are publications relating to patents or patent applications filed or owned by the present applicant.

PRIOR ART DOCUMENT

Patent Literature

Patent Literature 1: JP 2010-232623A
Patent Literature 2: JP 2010-516599A
Patent Literature 3: Japanese Patent No. 5397794
Patent Literature 4: Japanese Patent No. 5343224
Patent Literature 5: Japanese Patent No. 5397795
Patent Literature 6: JP 2014-72533A
Patent Literature 7: JP 2016-98166A
Patent Literature 8: JP 2016-100592A
Patent Literature 9: JP 2016-100593A

Non-Patent Literature

Non-Patent Literature 1: Kazuhide Kusakabe., et al., "Overgrowth of GaN layer on GaN nano-columns by RF-molecular beam epitaxy", Journal of Crystal Growth 237-239 (2002) 988-992
Non-Patent Literature 2: K. Y. Zang., et al., "Defect reduction by periodic SiNx interlayers in gallium nitride grown on Si (111)", Journal of Applied Physics 101, 093502 (2007)
Non-Patent Literature 3: Kentaro Kaneko, "Fabrication and physical properties of corundum structured alloys based on gallium oxide", Dissertion, Kyoto Univ., March 2013
Non-Patent Literature 4: Akio Takatsuka, Masaya Oda, Kentaro Kaneko, Shizuo FUJITA, Toshimi Hitora, "Epitaxiyal Lateral Overgrowth of α-$Ga_2O_3$ by Mist Epitaxy Technique" 62nd Spring School of Applied Physics, Tokai University, 2015 (Mar. 11-14, 2015), 13a-P18-12

SUMMARY OF INVENTION

Technical Problem

An object of the present invention is to provide a crystalline oxide semiconductor with an enhanced crystal quality that is useful in a semiconductor device requiring heat dissipation.

Solution to Problem

As a result of earnest examination to achieve the above object, the inventors found that, when forming a crystalline oxide semiconductor having at least a first crystal axis and a second crystal axis, making a second side of the crystalline oxide semiconductor shorter than a first side of the crystalline oxide semiconductor, making a linear thermal expansion coefficient of the first crystal axis direction smaller than a linear thermal expansion coefficient of the second crystal axis direction, making the first side direction to be parallel or substantially parallel to the first crystal axis direction and making the second side direction to be parallel or substantially parallel to the second crystal axis direction, can drastically reduce cracks. Further, the inventors found that the obtained crystalline oxide semiconductor has an enhanced thermal dispersibility not only a crystal quality and found that the crystalline oxide semiconductor is useful for a semiconductor device that requires heat dissipation. The inventors also found that the obtained crystalline oxide semiconductor can solve the above-mentioned problem.

In addition, after learning the above findings, the inventors have made further research to reach the present invention.

That is, the present invention relates to the followings.

[1] A crystalline oxide semiconductor including: a first crystal axis; a second crystal axis; a first side; a second side that is shorter than the first side; a linear thermal expansion coefficient of the first crystal axis; a linear thermal expansion coefficient of the second crystal axis that is larger than the linear thermal expansion coefficient of the first crystal axis; a direction of the first side; a direction of the first crystal axis that is parallel or substantially parallel to the direction of the first side; a direction of the second side; and a direction of the second crystal axis that is parallel or substantially parallel to the direction of the second side.

[2] The crystalline oxide semiconductor of [1] above, wherein the crystalline oxide semiconductor includes, as a major component, a metal oxide including gallium.

[3] The crystalline oxide semiconductor of [1] above, wherein the crystalline oxide semiconductor includes, as a major component, a metal oxide including a corundum structure.

[4] The crystalline oxide semiconductor of [3] above, wherein the metal oxide includes at least one metal selected from gallium, indium, rhodium and iridium.

[5] The crystalline oxide semiconductor of [3] above, wherein the metal oxide includes gallium, and indium and/or aluminum.

[6] The crystalline oxide semiconductor of [1] above, wherein each of the first side and the second side is represented by a straight line.

[7] The crystalline oxide semiconductor of [1] above, wherein the crystalline oxide semiconductor is in the shape of a film.

[8] The crystalline oxide semiconductor of [7] above, wherein the crystalline oxide semiconductor includes a corundum structure, and a principal plane of the crystalline oxide semiconductor is an a-plane, an m-plane or an r-plane.

[9] The crystalline oxide semiconductor of [7] above, wherein the crystalline oxide semiconductor includes a corundum structure, a principal plane of the crystalline oxide semiconductor is a c-plane, and the crystalline oxide semiconductor has an off angle that is 0.2° or more.

[10] A semiconductor device including: a semiconductor layer including the crystalline oxide semiconductor of any one of [1] above; and an electrode.

[11] The semiconductor device of [10] above, wherein the semiconductor device is a power device.

[12] The semiconductor device of [10] above, wherein the semiconductor device is a power module, an inverter or a converter.

[13] The semiconductor device of [10] above, wherein the semiconductor device is a power card.

[14] The semiconductor device of [13] above, wherein the semiconductor device includes a first cooling device and a second cooling device, and wherein the first cooling device is provided on a first side of the semiconductor layer via a first insulating member, and the second cooling device is provided on a second side of the semiconductor layer via a second insulating member, and wherein the second side of the semiconductor layer is opposite to the first side of the semiconductor layer.

[15] The semiconductor device of [14] above, further including a first heat dissipation layer that is provided on the first side of the semiconductor layer and a second heat dissipation layer that is provided on the second side of the semiconductor layer, and wherein the first cooling device is provided on the first heat dissipation layer via the first insulating member, and the second cooling device is provided on the second heat dissipation layer via the second insulating member.

[16] A semiconductor system including: the semiconductor device of [10] above.

Advantageous Effects of Invention

A crystalline oxide semiconductor of the present invention is excellent in crystalline quality, and is useful for semiconductor devices and the like requiring heat dissipation.

DESCRIPTION OF EMBODIMENTS

Figure 1:
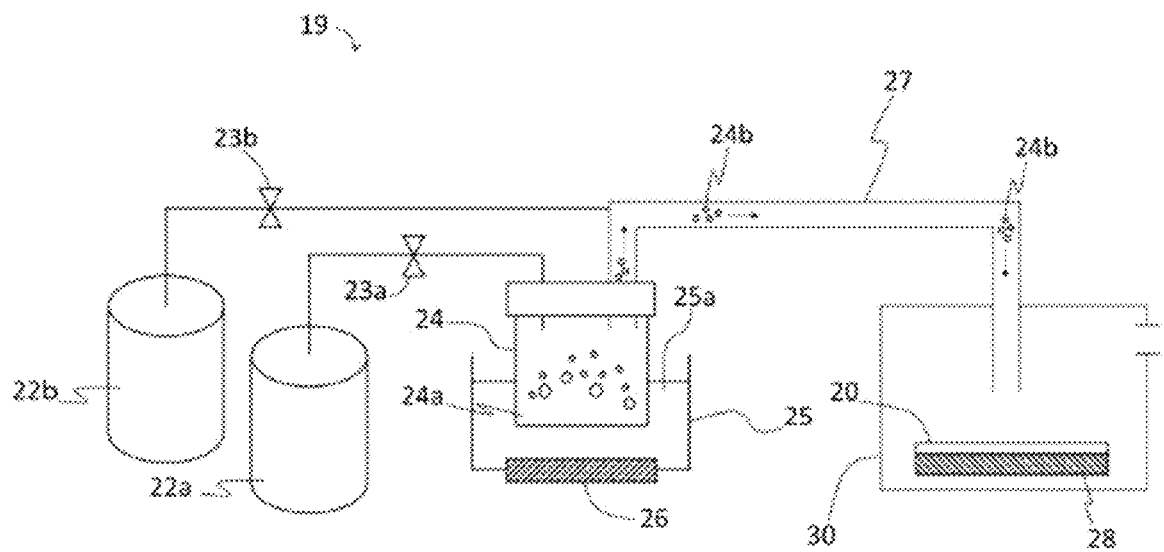
FIG. 1 is a schematic configuration diagram illustrating an embodiment of a deposition apparatus preferably used in the present invention.

A crystalline oxide semiconductor of the present invention is a crystalline oxide semiconductor including: a first crystal axis; a second crystal axis; a first side; and a second side that is shorter than the first side, a linear thermal expansion coefficient of the first crystal axis that is smaller than a linear thermal expansion coefficient of the second crystal axis, a direction of the first side that is parallel and/or substantially parallel to a direction of the first crystal axis, and a direction of the second side that is parallel and/or substantially parallel to a direction of the second crystal axis. The term "crystal axis" refers to a coordinate axis derived from a crystal structure in order to systematically describe a symmetries regarding crystal planes, rotations and the like. Further, "the first side" may be a straight line or a curve line. According to an embodiment of the present invention, in order to make a relationship between "the first side" and a crystal axis to be more improved, "the first side" is preferably a straight line. "The second side" may be a straight line or a curve line. According to an embodiment of the present invention, in order to make a relation between "the second side" and a crystal axis to be more improved, "the second side" is preferably a straight line. "Linear thermal expansion coefficient" is measured in accordance with JIS (Japanese Industrial Standards) R 3102 (1995). The term "Side direction" refers to a direction of a side constituting a particular shape. The term "substantially parallel" can include completely parallel and may not be completely parallel, and may be a slightly deviated aspect from "completely parallel" (e.g., the slightly deviated aspect may be greater than 0° and equal or smaller than 10°).

The crystalline oxide semiconductor preferably contains gallium and more preferably contains gallium oxide or a mixed crystal of gallium oxide as a major component. Further, a crystal structure and the like of the crystalline oxide semiconductor is not particularly limited. According to an embodiment of the present invention, the crystalline oxide semiconductor preferably contains a metal oxide having a corundum structure as a major component. The metal oxide is not particularly limited, but the metal oxide preferably contains one or more metals selected from metals of the fourth period to the sixth period in the periodic table. The metal oxide more preferably contains at least one metal selected from gallium indium, rhodium and iridium and most preferably contains gallium. Also, according to an embodiment of the present invention, the metal oxide preferably contains gallium, and indium and/or aluminum. Examples of the metal oxide containing gallium include $\alpha\text{-}Ga_2O_3$ or a mixed crystals of $\alpha\text{-}Ga_2O_3$. The crystalline oxide semiconductor containing such a preferable metal oxide as a major component enables more enhanced crystal quality and more enhanced heat dissipation, and also enables more enhanced semiconductor characteristics. The term "major component" herein means that the crystalline oxide semiconductor contains the metal oxide by 50% or more at a composition ratio within the crystalline oxide semiconductor, preferably contains 70% or more at a composition ratio and more preferably contains 90% or more. For example, if the metal oxide is $\alpha\text{-}Ga_2O_3$, $\alpha\text{-}Ga_2O_3$ is contained in the crystalline oxide semiconductor under the condition that an atomic ratio of gallium in all metal elements contained in the crystalline oxide semiconductor film is 0.5 or more. According to an embodiment of the present invention, the atomic ratio of gallium in all metal elements contained in a crystalline oxide semiconductor is preferably 0.7 or more, and further preferably 0.8 or more. The crystalline oxide semiconductor may be single crystal or polycrystalline. Further, the crystalline oxide semiconductor is in general in the shape of a film, but not particularly limited unless it deviates from an object of the present invention. The crystalline oxide semiconductor may be in the shape of a plate and may be in the shape of a sheet.

The crystalline oxide semiconductor may also contain a dopant. The dopant is not particularly limited unless it deviates from an object of the present invention. The dopant may be an n-type dopant and may be a p-type dopant. Examples of the n-dopant include tin, germanium, silicon, titanium, zirconium, vanadium and niobium. A concentration of the dopant in the crystalline oxide semiconductor may be appropriately set, and more specifically, for example, the concentration of the dopant may be approximately $1\times10^{16}/cm^3 \sim 1\times10^{22}/cm^3$. The concentration of the dopant may also be a low concentration, for example, approximately $1\times10^{17}/cm^3$ or less. Furthermore, according to an embodiment of the present invention, the dopant may be contained at a high concentration of approximately $1\times10^{20}/cm^3$ or more.

The crystalline oxide semiconductor may be obtained by, for example, the following preferable deposition methods.

The crystalline oxide semiconductor may be obtained, by a method including mist-CVD method or mist-epitaxy method using a crystal substrate including at least a first crystal axis and a second crystal axis. The method is configured to form the crystalline oxide semiconductor including: a second side that is shorter than a first side, a linear thermal expansion coefficient of a direction of a first crystal axis that is smaller than a linear thermal expansion coefficient of a direction of a second crystal axis, a direction of the first side that is parallel or substantially parallel to a direction of the first crystal axis, and a direction of the second side that is parallel or substantially parallel to a direction of the second crystal axis.

(Crystal Substrate)

The crystal substrate is not particularly limited unless it deviates from an object of the present invention, and may be a known substrate. The crystal substrate may be an insulator substrate, conductive substrate and may be a semiconductor substrate. The crystal substrate may be a single crystal substrate or may be a polycrystalline substrate. Examples of the crystal substrate include a substrate containing a corundum-structured crystal as a major component. The term "major component" herein means that the substrate contains the corundum-structured crystal at a composition ratio of 50%, preferably contains the corundum-structured crystal at a composition ratio of 70% and more preferably contains the corundum-structured crystal at a composition ratio of 90% or more. Examples of the crystal substrate having the corundum structure include a sapphire substrate and an $\alpha$-type gallium oxide substrate.

According to an embodiment of the present invention, the crystal substrate may be preferably a sapphire substrate. Examples of the sapphire substrate include a c-plane sapphire substrate, an m-plane sapphire substrate, an a-plane sapphire substrate and an r-plane sapphire substrate. Further, the sapphire substrate may include an off-angle. The off-angle is not particularly limited, and may be equal to or more than 0.010, may be preferably equal to or more than 0.2°, and may be more preferably in a range of from 0.2° to 120. A crystal growth plane of the sapphire substrate is preferably an a-plane, an m-plane or an r-plane. It is also preferable that the sapphire substrate is a c-plane sapphire substrate having an off-angle of equal to or more than 0.2°.

A thickness of the crystal substrate is not particularly limited, but is generally in a range of 10 µm~20 mm, more preferably in a range of 10 µm~1000 µm.

The crystalline substrate is preferably in the shape that includes at least a first crystal axis and a second crystal axis, or preferably includes grooves corresponding to the first crystal axis and the second crystal axis. Such a preferable crystal substrate enables, in making the crystalline oxide semiconductor, to make more easily the crystalline oxide semiconductor including a second side that is shorter than a first side; a linear thermal expansion coefficient of a direction of a first crystal axis that is smaller than a linear thermal expansion coefficient of a direction of a second crystal axis; a direction of the first side that is parallel or substantially parallel to a direction of the first crystal axis; and a direction of the second side that is parallel or substantially parallel to a direction of the second crystal axis. In other words, by using such a preferable crystal substrate, the crystalline oxide semiconductor can be easily obtained. According to an embodiment of the present invention, it is also preferable that an ELO mask is used to control a direction of crystal growth and the like, in order to make more easily the crystalline oxide semiconductor including the second side that is shorter than the first side; the linear thermal expansion coefficient of the direction of the first crystal axis that is smaller than the linear thermal expansion coefficient of the direction of the second crystal axis; the direction of the first side that is parallel or substantially parallel to the direction of the first crystal axis; and the direction of the second side that is parallel or substantially parallel to the direction of the second crystal axis.

Examples of a preferable shape of the crystal substrate includes triangle, square (e.g., rectangular or trapezoid, etc.), polygon such as pentagon or hexagon, U-shape, inverted U-shape, L-shape and channel-shape.

According to an embodiment of the present invention, another layer such as a buffer layer and a stress relaxation layer may be provided on the crystal substrate. Examples of the buffer layer include a layer containing a metal oxide having a crystal structure identical to the crystal structure of the crystal substrate or the crystalline oxide semiconductor. Further, examples of the stress relaxation layer includes an ELO mask layer.

A method of epitaxial crystal growth is not particularly limited unless it deviates from an object of the present invention, and may be a known method. Examples of the method of epitaxial crystal growth include CVD method, MOCVD method, MOVPE method, Mist CVD method, Mist Epitaxy method, MBE method, HVPE method, Pulse Growth method and ALD method. According to the present invention, the method of the epitaxial crystal growth is preferably Mist CVD method or Mist Epitaxy method.

According to the Mist CVD method or the Mist Epitaxy method, the crystalline oxide semiconductor is formed by, atomizing the raw material solution containing a metal (atomizing step), so as to float the droplets, carrying the resulting atomized droplets to the vicinity of the crystal substrate by using a carrier gas (carrying step), and carrying out a thermal reaction of the atomized droplets (deposition step).

(Raw Material Solution)

The raw material solution is not particularly limited as long as the raw material solution contains a metal as a deposition material and the raw material solution can be atomized. The raw material solution may include an inorganic material or an organic material. The metal is not particularly limited unless it deviates from an object of the present invention, and may be a single metal or a metal compound. The metal may be one or more metals selected from among gallium (Ga), iridium (Ir), indium (In), rhodium (Rh), aluminum (Al), gold (Au), silver (Ag), platinum (Pt), copper (Cu), iron (Fe), manganese (Mn), nickel (Ni), palladium (Pd), cobalt (Co), ruthenium (Ru), chromium (Cr), molybdenum (Mo), tungsten (W), tantalum (Ta), zinc (Zn), lead (Pb), rhenium (Re), titanium (Ti), tin (Sn), magnesium (Mg), calcium (Ca) and zirconium (Zr). According to an embodiment of the present invention, the metal preferably contains one or more metals selected from a metal of the fourth period to sixth period in the periodic table, more preferably contains at least gallium, indium, rhodium or iridium. According to an embodiment of the present invention, the metal preferably contain gallium, and indium and/or aluminum. Such a preferable metal enables to form the crystalline oxide semiconductor that can be suitably applied to semiconductor devices and the like.

According to an embodiment of the present invention, a raw material solution containing at least one metal, in a form of complex or salt, dissolved or dispersed in an organic solvent or water may be used. Examples of the form of the complex include an acetylacetonate complex, a carbonyl complex, an ammine complex, a hydride complex. Also, examples of the form of the salt include an organic metal salt (e.g., metal acetate, metal oxalate, metal citrate, etc.), metal sulfide, metal nitrate, phosphorylated metal, metal halide (e.g., metal chloride, metal bromide, metal iodide, etc.).

A solvent of the raw material solution is not particularly limited unless it deviates from an object of the present invention, and the solvent may be an inorganic solvent such as water. The solvent may be an organic solvent such as alcohol. Also, the solvent may be a mixed solvent of the inorganic solvent and the organic solvent. According to an embodiment of the present invention, the solvent preferably includes water.

Further, the raw material solution may contain a hydrohalic acid and/or an oxidant as an additive. Examples of the hydrohalic acid include hydrobromic acid, hydrochloric acid and hydroiodic acid. Examples of the oxidant include hydrogen peroxide ($H_2O_2$), sodium peroxide ($Na_2O_2$), barium peroxide ($BaO_2$), a peroxide including benzoyl peroxide ($C_6H_5CO)_2O_2$, hypochlorous acid (HClO), perchloric acid, nitric acid, ozone water, and an organic peroxide such as peracetic acid and nitrobenzene.

The raw material solution may contain a dopant. The dopant is not particularly limited unless it deviates from an object of the present invention. Examples of the dopant include n-type dopants. The n-type dopants may include tin, germanium, silicon, titanium, zirconium, vanadium or niobium. Also, examples of the dopant include p-type dopants. The dopant concentration in general may be in a range of from approximately in a range of from $1\times10^{16}/cm^3$ to $1\times10^{22}/cm^3$. The dopant concentration may be at a lower concentration of, for example, approximately equal to or less than $1\times10^{17}/cm^3$. According to an embodiment of the present invention, the dopant may be contained at a high concentration of, for example, approximately equal to or more than $1\times10^{20}/cm^3$.

(Atomization Step)

At an atomization step, the raw material solution is prepared, and the raw material solution is atomized so as to float droplets and to generate atomized droplets. A concentration of the metal contained in the raw material solution is not particularly limited. The concentration of the metal contained in the raw material solution may be preferably in a range of 0.0001 mol/L~20 mol/L with respect to the entire raw material solution. A method to atomize the raw material solution is not particularly limited if it is possible to atomize the raw material solution and may be a known atomizing method. According to an embodiment of the present invention, the method to atomize the raw material solution is an atomizing method using ultrasonic vibration. A mist used in the present invention is capable of being suspended in the air. The mist used in an embodiment of the present invention have an initial rate of zero to be delivered as a gas, is not blown like a spray, for example, and thus, is not damaged by collision energy. Accordingly, the mist obtained using ultrasonic vibration is preferable. A size of the mist is not particularly limited, and the mist may be approximately several mm. The size of the mist is preferably equal to or less than 50 μm, and more preferably in a range of 1 μm~10 μm.

(Carrying Step)

At a carrying step, the atomized droplets are delivered to the substrate by using a carrier gas. The carrier gas is not particularly limited unless it deviates from an object of the present invention. Examples of the carrier gas include oxygen, ozone, an inert gas such as nitrogen and argon and a reducing gas such as hydrogen gas and a forming gas. Further, the carrier gas may contain one or two or more gasses. Also, a diluted gas (e.g., 10-fold diluted carrier gas) and the like may be further used as a second carrier gas. The carrier gas may be supplied from one or more locations. While a flow rate of the carrier gas is not particularly limited, the flow rate of the carrier gas may be preferably not more than 1 LPM, and more preferably in a range of 0.1 LPM~1 LPM.

(Depositing Step)

At a depositing step, deposition is made on the crystal substrate by a reaction of the atomized droplets. The reaction is not particularly limited as long as the film is formed from the atomized droplets in the reaction, but according to an embodiment of the present invention, the reaction is preferably a thermal reaction. The thermal reaction may be a reaction in which the atomized droplets react with heat, and reaction conditions and the like are not particularly limited unless it deviates from an object of the present invention. In the depositing step, the thermal reaction is in general carried out at an evaporation temperature of the solvent of the raw material solution or at a higher temperature than the evaporation temperature. The temperature during the thermal reaction should not be too high, and preferably equal to or less than 650° C. Further, the thermal reaction may be conducted in any atmosphere of a vacuum, a non-oxygen atmosphere, a reducing gas atmosphere and an oxygen atmosphere. Also, the thermal reaction may be conducted in any condition of under an atmospheric pressure, under an increased pressure, and under a reduced pressure, unless it deviates from an object of the present invention. According to an embodiment of the present invention, the thermal reaction is preferably conducted under the atmospheric pressure because a calculation of an evaporation temperature would be easier and an equipment and the like would be more simplified. Further, a film thickness of the crystalline oxide semiconductor can be set by adjusting a deposition time.

Hereinafter, with reference to drawings, a deposition apparatus 19 used in an embodiment of the present invention is described. The deposition apparatus 19 of FIG. 1 includes a carrier gas source 22a to supply a carrier gas, a flow control valve 23a that is configured to control a flow rate of the carrier gas supplied from the carrier gas source 22a, a carrier gas (diluted) source 22b to supply a carrier gas (diluted), a flow control valve 23b that is configured to control a flow rate of the carrier gas supplied (diluted) from the carrier gas (diluted) source 22b, a mist generator 24 containing a raw material solution 24a, a container 25 containing water 25a, an ultrasonic transducer 26 attached to a bottom of the container 25, a deposition chamber 30, a quartz supply pipe 27 connecting from the mist generator 24 to the deposition chamber 30, and a hot plate (heater) 28 arranged in the deposition chamber 30. A substrate 20 may be set on the hot plate 28.

Then, as described in FIG. 1, the raw material solution 24a is set in the mist generator 24. The substrate 20 is placed on the hot plate 28. The hot plate 28 is activated to raise a temperature in the deposition chamber 30. Then, the flow control valve 23 (23a, 23b) is opened to supply the carrier gas from the carrier gas source 22 (22a, 22b) into the deposition chamber 30. After the atmosphere in the deposition chamber 30 is sufficiently replaced with the carrier gas, the flow rate of the carrier gas and the carrier gas (diluted) are adjusted respectively. The ultrasonic transducer 26 is then vibrated, and a vibration propagate through the water 25a to the raw material solution 24a to atomize the raw material solution 24a to generate atomized droplets 24b. The atomized droplets 24b are introduced into the deposition chamber 30 by the carrier gas, and is delivered to the substrate 20. Then, under an atmospheric pressure, the atomized droplets 24b in the deposition chamber 30 is thermally reacted to form a film on the substrate 20.

Figure 2:
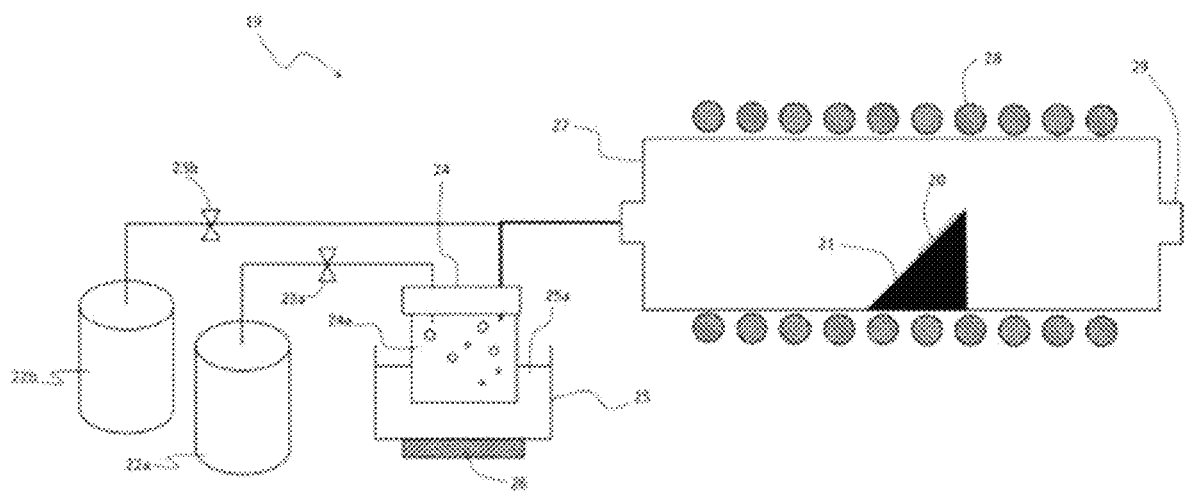
FIG. 2 is a schematic configuration diagram illustrating another embodiment of a deposition apparatus (mist CVD) preferably used in the present invention.

Further, it is also preferable to use a mist CVD apparatus (deposition apparatus) 19 shown in FIG. 2. The Mist CVD apparatus 19 of FIG. 2 includes a susceptor 21 on which a substrate 20 is placed, a carrier gas supply device 22a to supply a carrier gas, a flow rate control valve 23a that is configured to control a flow rate of the carrier gas supplied from the carrier gas supply device 22a, a carrier gas (diluted) supply device 22b, a flow rate control valve 23b that is configured to control a flow rate of the carrier gas (diluted) supplied from the carrier gas (dilute) supply device 22b, a mist generator 24 containing a raw material solution 24a, a container 25 containing water 25a, an ultrasonic transducer 26 attached to a bottom of the container 25, a supply pipe 27 made of a quartz tube having an inner diameter of 40 mm, a heater 28 arranged at a peripheral portion of the supply pipe 27, an air duct 29 that is configured to emit mist and droplets after thermal reaction and to emit an exhaust gas. The susceptor 21 is made of quartz. The susceptor 21 includes a surface that is slanted off the horizontal and on that the substrate 20 is arranged. Since the susceptor 21 and the supply pipe 27 that is configured to be a deposition chamber are made of quartz, impurities from the device that is introduced into the film formed on the substrate 20 is suppressed. The Mist CVD apparatus 19 can be treated in the same way as the deposition apparatus 19 of FIG. 1 that is described above.

By using the preferable deposition apparatus described above, it is possible to form the crystal oxide semiconductor on the crystal growth plane of the crystal substrate more easily. The crystal oxide semiconductor is in general formed by epitaxial crystal growth.

The crystalline oxide semiconductor is useful for a semiconductor device, and particularly useful for a power device. Examples of the semiconductor device produced by using the crystalline oxide semiconductor include a transistor and TFT such as MIS (Metal Insulator Semiconductor) or HEMT (High Electron Mobility Transistor), Schottky barrier diode using a semiconductor-metal junction, JBS (Junction Barrier Schottky diode), PN or PIN diode combined with other P-layer, a light emitting and receiving device. According to an embodiment of the present invention, the crystalline oxide semiconductor may be applied to a semiconductor device after peeling off the crystalline oxide semiconductor from the crystal substrate.

Further, the semiconductor device according to an embodiment of the present invention may be applied to lateral devices and vertical devices. In a lateral device, a first electrode and a second electrode may be formed on one side of a semiconductor layer. In a vertical device, a first electrode may be formed on a first side of a semiconductor layer and a second electrode may be formed on a second side of the semiconductor layer. According to an embodiment of the present invention, the semiconductor is preferably applied to the vertical device. Examples of the semiconductor device include a Schottky barrier diode (SBD), a junction barrier Schottky diodes (JBS), a metal semiconductor field effect transistor (MESFET), a high electron mobility transistor (HEMT), a metal oxide semiconductor field effect transistor (MOSFET), a static induction transistor (SIT), a junction field effect transistor (JFET), an insulated-gate bipolar transistor (IGBT) and a light emitting diode (LED).

Hereinafter, with reference to figures, examples of the semiconductor device in which the crystalline oxide semiconductor according to the present invention is used as an n-type semiconductor layer (that may be an n+-type semiconductor or an n-semiconductor layer) are explained, however, the present invention is not limited thereto.

Figure 10:
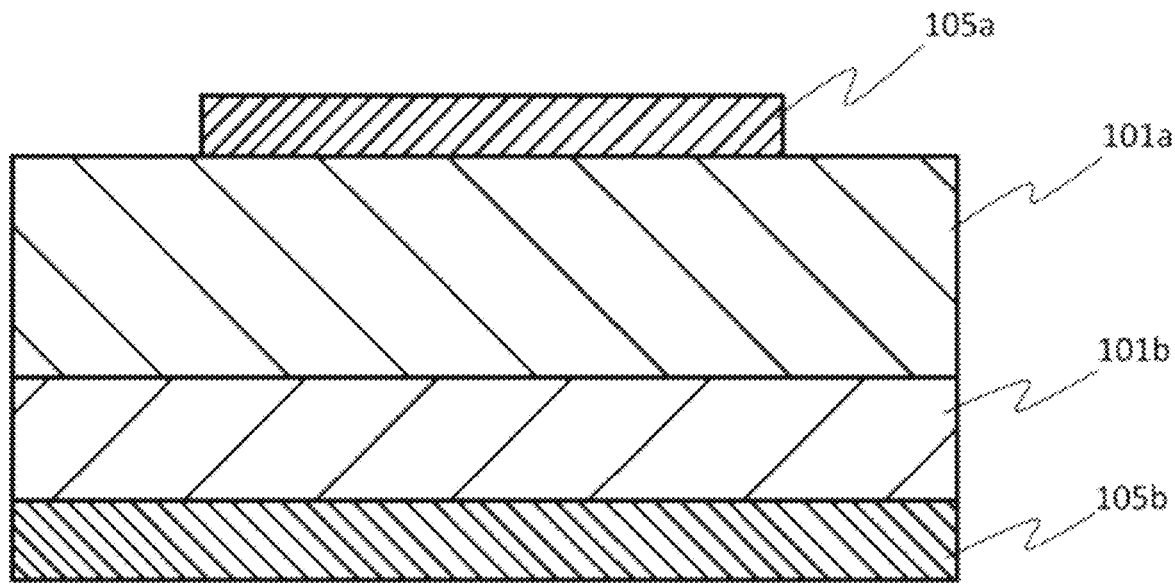
FIG. 10 is a schematic diagram illustrating an embodiment of a Schottky barrier diode (SBD).

FIG. 10 is a schematic diagram illustrating an embodiment of a Schottky barrier diode (SBD) according to the present invention. The SBD in FIG. 10 includes an n--type semiconductor layer 101a, an n+-type semiconductor layer 101b, a Schottky electrode 105a and an Ohmic electrode 105b.

The material of the Schottky electrode and the Ohmic electrode may be a known material. Examples of the electrode material include Al, Mo, Co, Zr, Sn, Nb, Fe, Cr, Ta, Ti, Au, Pt, V, Mn, Ni, Cu, Hf, W, Ir, Zn, In, Pd, Nd, Ag and/or alloys thereof, metal oxide conductive films such as tin oxide, zinc oxide, rhenium oxide, indium oxide, indium tin oxide (ITO), and indium zinc oxide (IZO), organic conductive compounds such as polyaniline, polythiophene, and polypyrrole, and a mixture or a multilayer structure of these materials.

The formation of the Schottky electrode and the Ohmic electrode can be performed by, for example, a known method such as a vacuum evaporation method or a sputtering method. For more details, if a Schottky electrode is formed by using two metals including a first metal and a second metal, a layer of the first metal may be arranged on a layer of the second metal, and patterning may be conducted on the layers of the first metal and the second metal by using a photolithography method.

When a reverse bias is applied to the SBD illustrated in FIG. 10, a depletion layer (not illustrated) spreads in the n-type semiconductor layer 101a resulting in the SBD to have a high breakdown voltage. In addition, when a forward bias is applied to the SBD, electrons flow from the Ohmic electrode 105b to the Schottky electrode 105a. Thus, the SBD using a semiconductor structure including the crystalline oxide semiconductor is excellent for high withstand voltage and high current, has a high switching speed, and is excellent in withstand voltage and reliability.

(HEMT)

Figure 11:
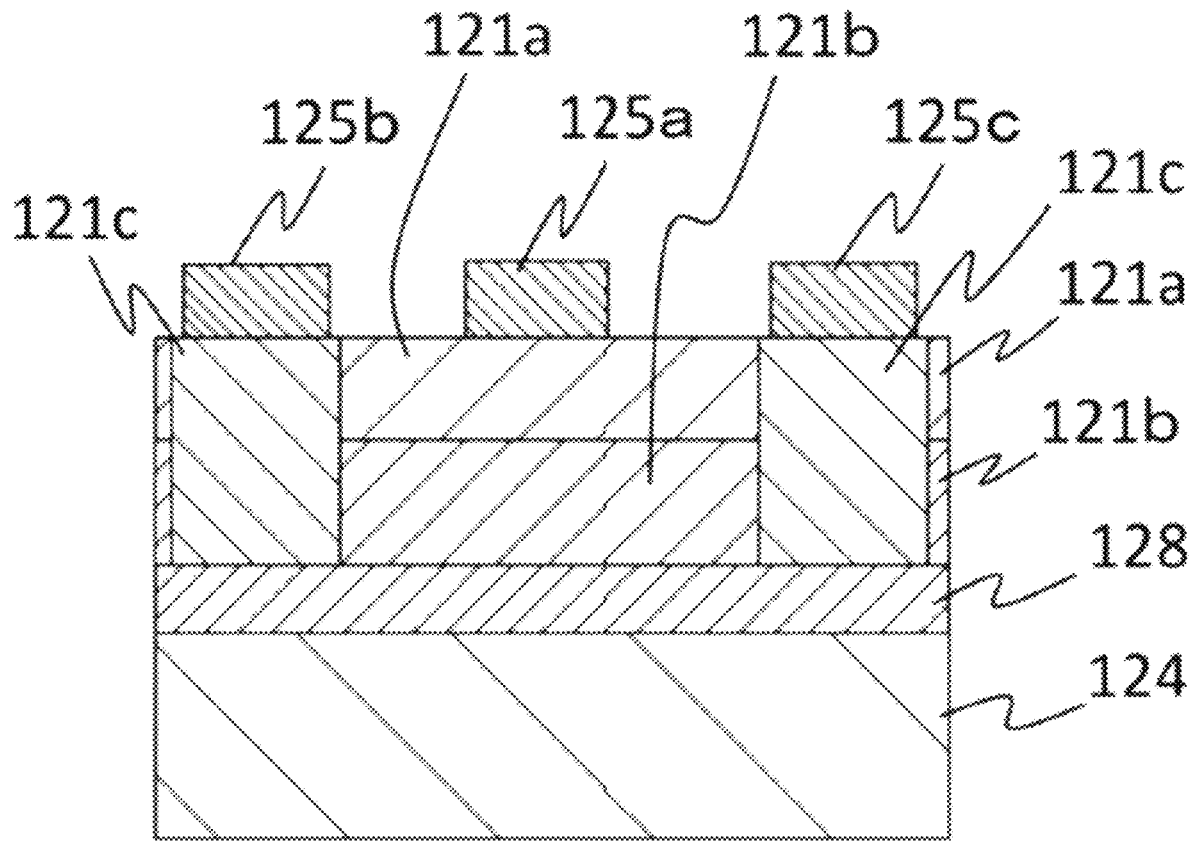
FIG. 11 is a schematic diagram illustrating an embodiment of a High Electron Mobility Transistor (HEMT).

FIG. 11 is a schematic diagram illustrating an embodiment of a high-electron-mobility transistor (HEMT) according to the present invention including an n-type semiconductor layer with wide band gap 121a, an n-type semiconductor layer with narrow band gap 121b, an n+-type semiconductor layer 121c, a semi-insulating layer 124, a buffer layer 128, a gate electrode 125a, a source electrode 125b and a drain electrode 125c.

(MOSFET)

Figure 12:
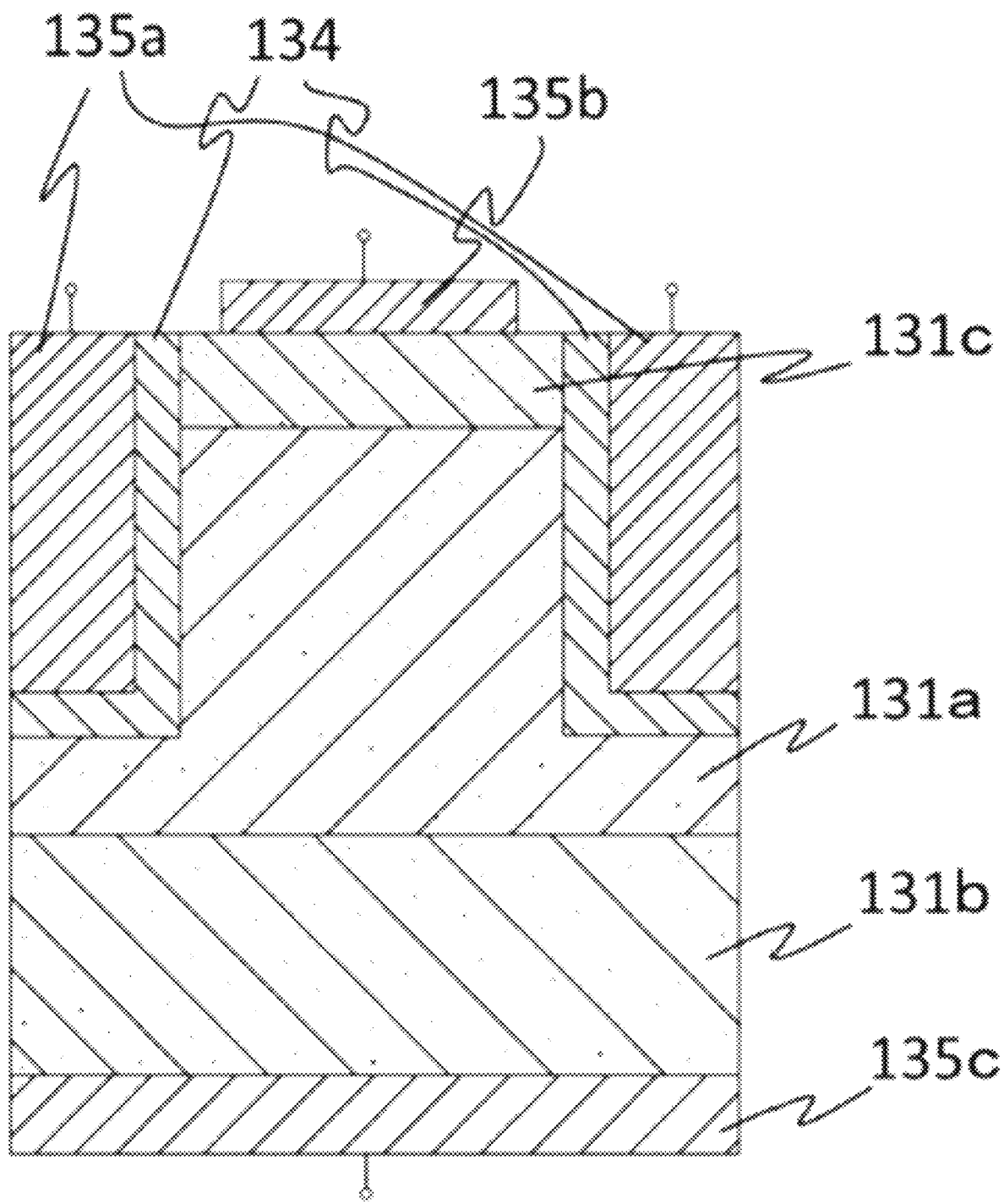
FIG. 12 is a schematic diagram illustrating an embodiment of a Metal Oxide Semiconductor Field Effect Transistor (MOSFET).

FIG. 12 is a schematic diagram illustrating an embodiment of a metal oxide semiconductor field-effect transistor (MOSFET) according to the present invention. The MOSFET includes an n--type semiconductor layer 131a, a first n+-type semiconductor layer 131b, a second n+-type semiconductor layer 131c, a p-type semiconductor layer 132, a p+-type semiconductor layer 132a, a gate insulating layer 134, a gate electrode 135a, a source electrode 135b and a drain electrode 135c.

(JFET)

Figure 13:
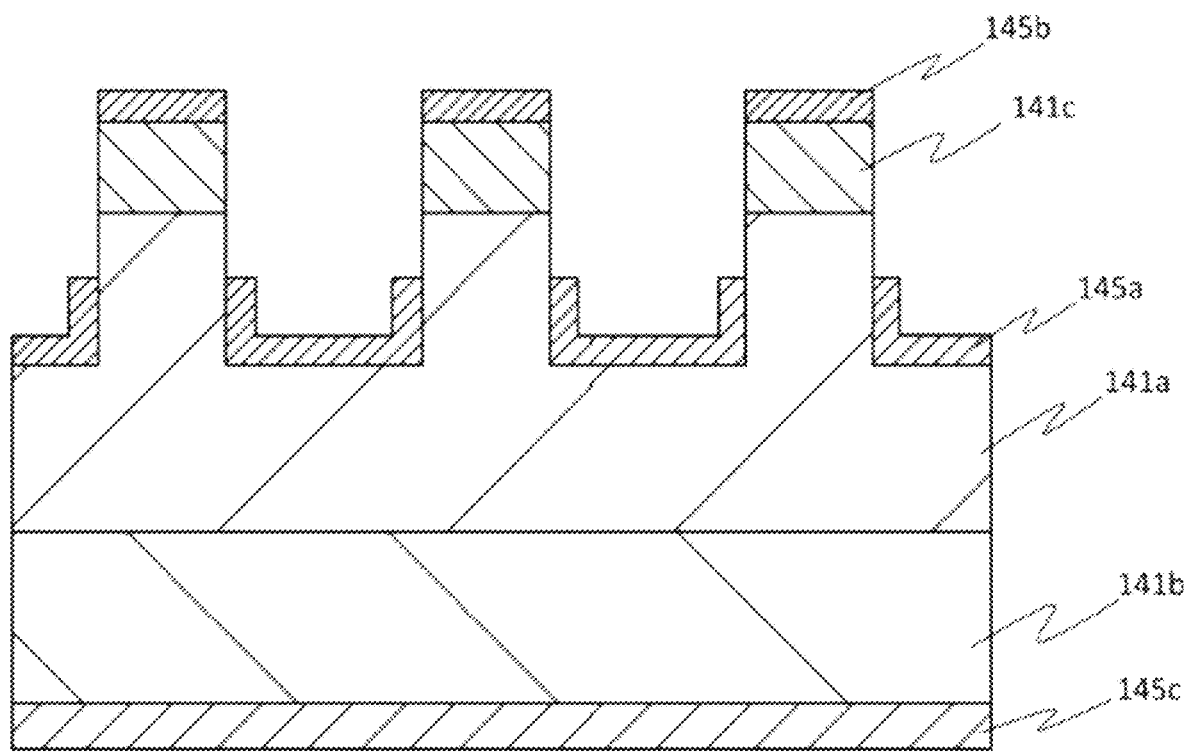
FIG. 13 is a schematic diagram illustrating an embodiment of a Junction Field Effect Transistor (JFET).

FIG. 13 is a schematic diagram illustrating an embodiment of a junction field-effect transistor (JFET) according to the present invention including an n--type semiconductor layer 141a, a first n+-type semiconductor layer 141b, a second n+-type semiconductor layer 141c, a p-type semiconductor layer 142, a gate electrode 145a, a source electrode 145b and a drain electrode 145c.

(IGBT)

Figure 14:
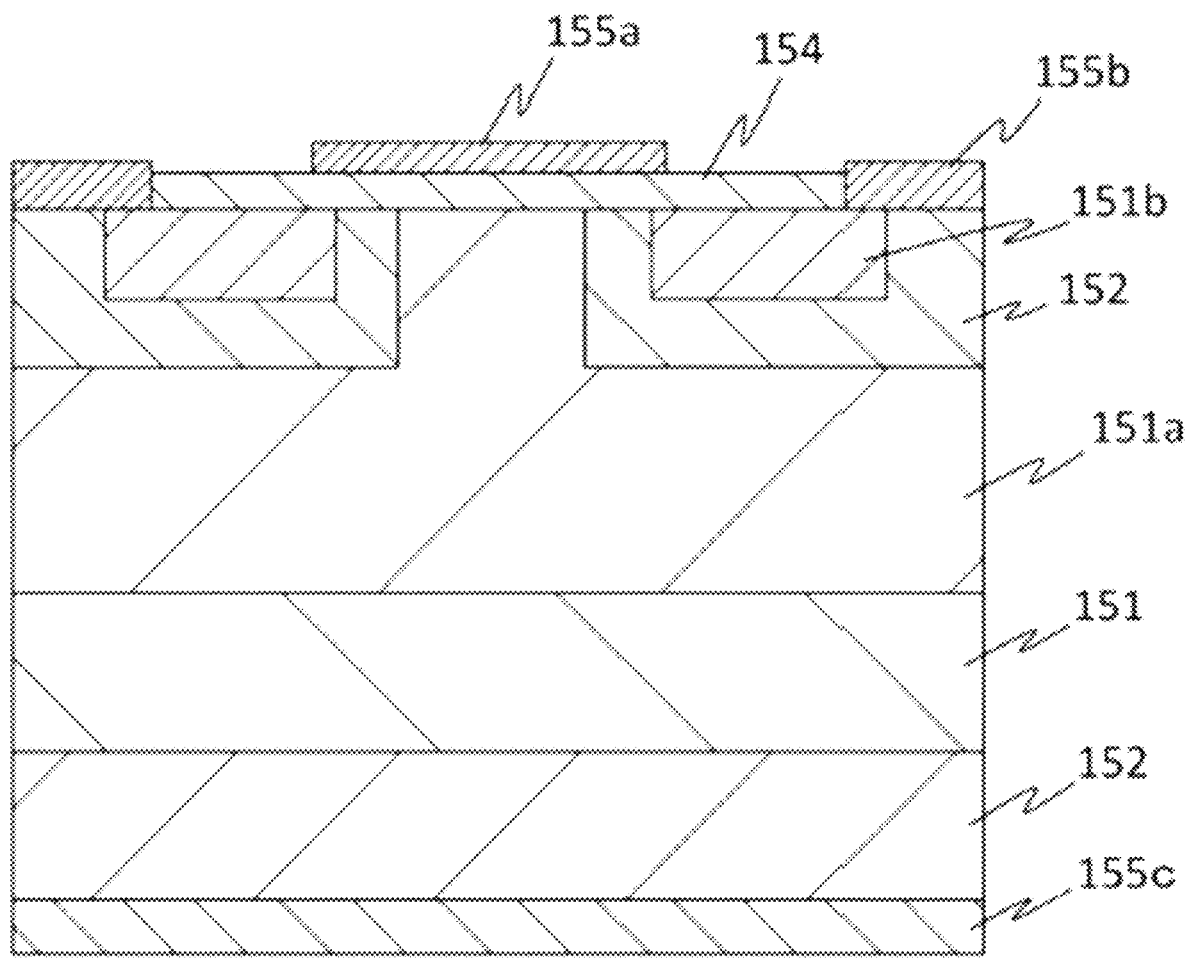
FIG. 14 is a schematic diagram illustrating an embodiment of an Insulated Gate Bipolar Transistor (IGBT).

FIG. 14 is a schematic diagram illustrating an embodiment of an insulated gate bipolar transistor (IGBT) according to the present invention including an n-type semiconductor layer 151, an n--type semiconductor layer 151a, an n+-type semiconductor layer 151b, a p-type semiconductor layer 152, a gate insulating film 154, a gate electrode 155a, an emitter electrode 155b and a collector electrode 155c.

(LED)

Figure 15:
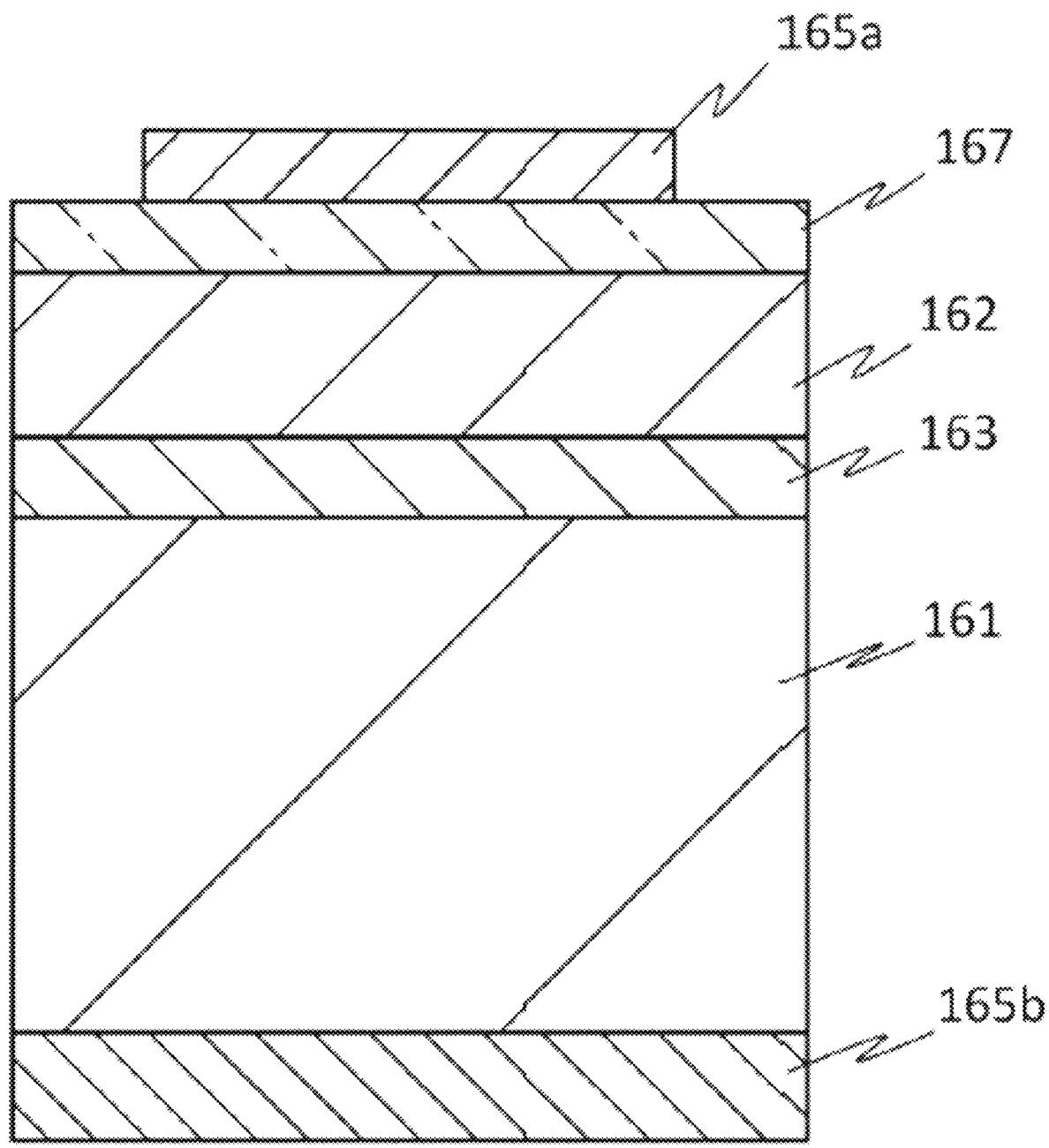
FIG. 15 is a schematic diagram illustrating an embodiment of a Light Emitting Diode (LED).

FIG. 15 is a schematic diagram illustrating an embodiment of a light emitting diode (LED) according to the present invention. The LED illustrates in FIG. 15 includes an n-type semiconductor layer 161 on a second electrode 165b, and a light emitting layer 163 is positioned on the n-type semiconductor layer 161. Also, a p-type semiconductor layer 162 is positioned on the light emitting layer 163. A light-transmitting electrode 167, that permeates the light generated in the light emitting layer 163, is provided on the p-type semiconductor layer 162. The light emitting device illustrated in FIG. 15 may be covered with a protective layer except for the electrode portion.

Examples of the material of the light-transmitting electrode include oxide conductive material containing indium or titanium. Regarding the material of the light-transmitting electrode, in detail, the material may be $In_2O_3$, ZnO, $SnO_2$, $Ga_2O_3$, $TiO_2$, $CeO_2$ a mixed crystal thereof. The material may contain a dopant. By providing those materials using known method such as sputtering, the translucent electrode would be formed. Also, annealing may be carried out after forming the light-transmitting electrode, in order to make the electrode more transparent.

According to the light emitting diode of FIG. 15, the light emitting layer 163 is configured to emit light by applying a current to the p-type semiconductor layer 162, the light emitting layer 163, and the n-type semiconductor layer 161, through the first electrode 165a as a positive electrode and a second electrode 165b as a negative electrode.

Examples of the material of the first electrode 165a and the second electrode 165b include Al, Mo, Co, Zr, Sn, Nb, Fe, Cr, Ta, Ti, Au, Pt, V, Mn, Ni, Cu, Hf, W, Ir, Zn, In, Pd, Nd, Ag and/or alloys thereof, metal oxide conductive films such as tin oxide, zinc oxide, rhenium oxide, indium oxide, indium tin oxide (ITO), and indium zinc oxide (IZO), organic conductive compounds such as polyaniline, polythiophene, and polypyrrole, and mixtures of these materials. Examples of a forming method of the first and the second electrode include wet methods such as printing method, spray method, coating method, physical methods such as vacuum deposition method, sputtering method, ion plating method, chemical methods such as CVD method, plasma CVD method. The forming method may be selected from above mentioned methods in consideration of a suitability for the material of the first electrode and the second electrode.

Figure 16:
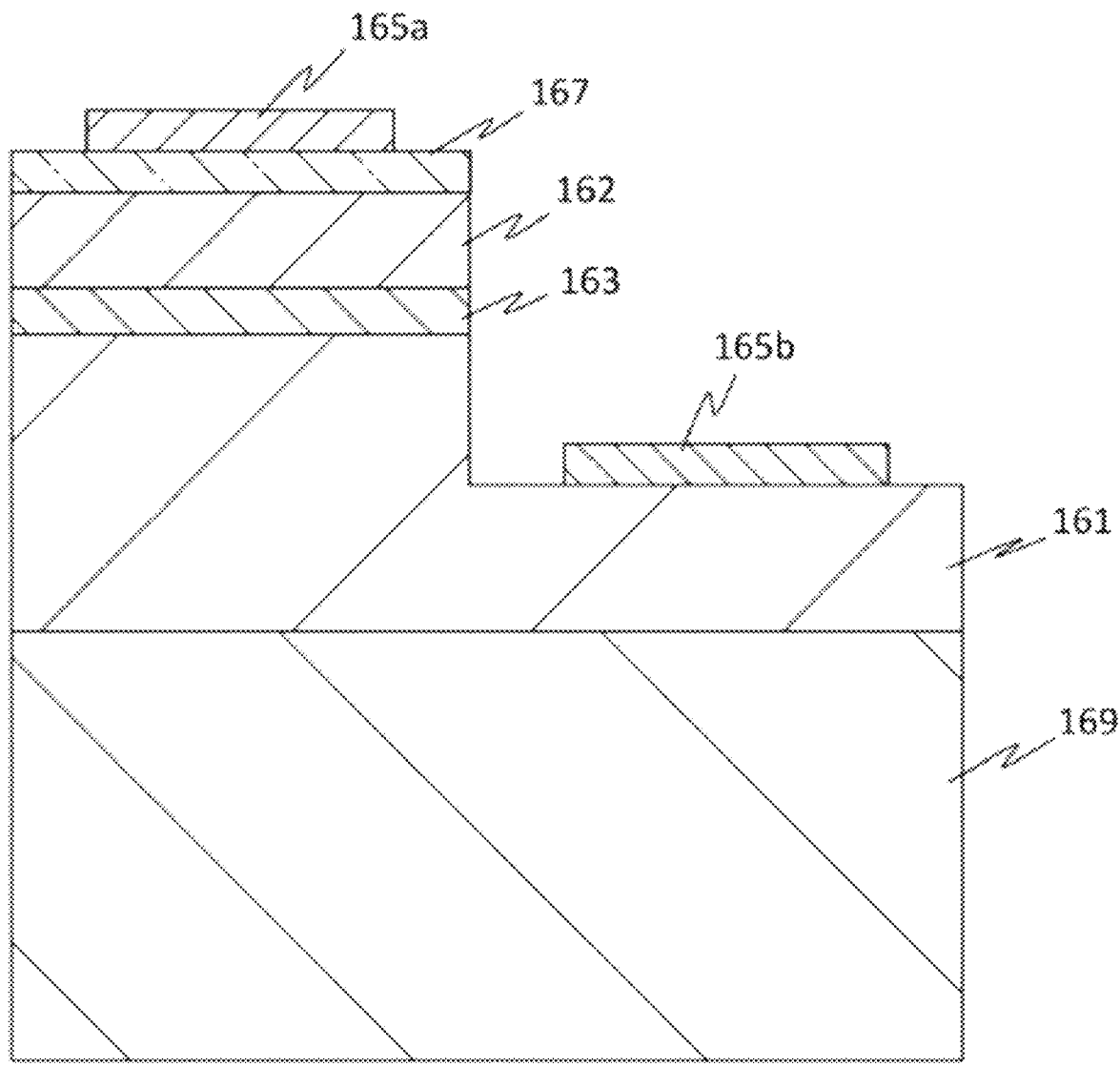
FIG. 16 is a schematic diagram illustrating an embodiment of a Light Emitting Diode (LED).

Also, FIG. 16 illustrates another embodiment of a light-emitting diode. In the light-emitting diode illustrated in FIG. 16, an n-type semiconductor layer 161 is arranged on a substrate 169, and a p-type semiconductor layer 162, a light-emitting layer 163 and the n-type semiconductor layer 161 are partly removed to expose the n-type semiconductor layer 161, and a second electrode 165b is arranged on a part of the exposed surface of the n-type semiconductor layer 161.

Figure 17:
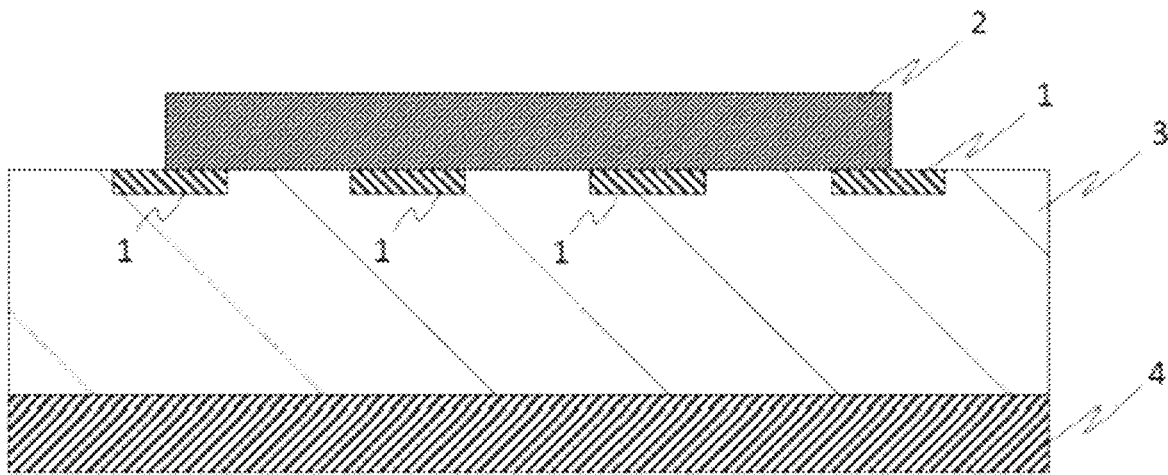
FIG. 17 is a schematic diagram illustrating an embodiment of a Junction Barrier Schottky Diode (JBS).

FIG. 17 illustrates a junction barrier Schottky diode (JBS) according to an embodiment of the present invention. A semiconductor device of FIG. 17 includes a semiconductor region (a semiconductor layer) 3, a barrier electrode 2 that is provided on the semiconductor region and is capable of forming a Schottky barrier with the semiconductor region, and a barrier height adjustment layer that is provided between the barrier electrode 2 and the semiconductor region 3, and is capable of forming a Schottky barrier with the semiconductor region 3. Here, barrier height between the barrier height adjustment layer and the semiconductor layer is larger than barrier height between the barrier electrode 2 and the semiconductor region 3. The barrier height adjustment layer 1 is embedded in the semiconductor region 3. According to an embodiment of the present invention, the barrier height adjustment layer is preferably provided at regular intervals, and is more preferably provided respectively between the semiconductor region and both ends of the barrier electrode. Such a preferable embodiment enables to configure the JBS with enhanced thermal stability and adhesion, further reduced current leakage, and excellent in semiconductor characteristics such as withstand voltage. The semiconductor device illustrated in FIG. 17 includes an Ohmic electrode 4 arranged on the semiconductor region 3.

A method of forming each layer included in the semiconductor device of FIG. 17 is not particularly limited unless it deviates from an object of the present invention, and may be a known method. Examples of the method of forming the each layer include a method in which, after a film is formed using a vacuum evaporation method, a CVD method, a sputtering method or other various coating techniques, patterning is conducted by photolithography. Also, examples of the method of forming the each layer include a method in which patterning is conducted directly by using a printing technique and the like.

Figure 18:
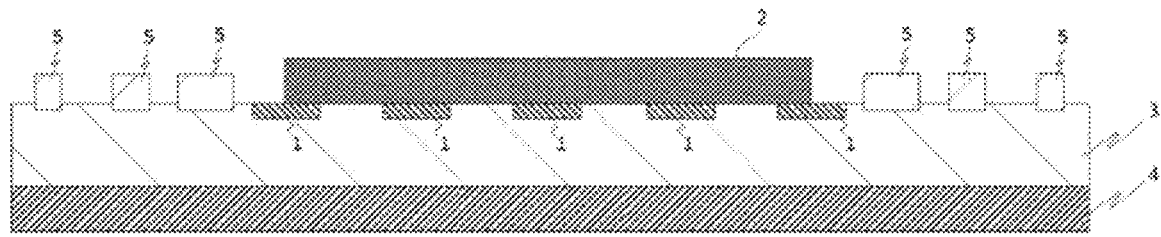
FIG. 18 is a schematic diagram illustrating an embodiment of a Junction Barrier Schottky Diode (JBS).

FIG. 18 illustrates a junction barrier Schottky diode (JBS) according to an embodiment of the present invention. A semiconductor device of FIG. 18 differs from the semiconductor device of FIG. 17 in that including a guard ring 5 provided on the outer peripheral portion of the barrier electrode. This configuration of the semiconductor device of FIG. 18 enables the semiconductor device with enhanced semiconductor characteristics such as withstand voltage. According to an embodiment of the present invention, by respectively embedding a portion of the guard ring 5 into a surface of the semiconductor region (semiconductor layer) 3, it is possible to make a breakdown voltage more effectively more excellent. Further, by using a metal with a high barrier height as the guard ring, it is possible to provide the guard ring industrially advantageously together with a formation of the barrier electrode without significantly affecting the semiconductor region, so that the guard ring can be formed without deteriorating an on-resistance.

A material with a high barrier height is in general used as the guard ring. Examples of the material used as the guard ring include a conductive material with a barrier height of equal to or more than 1 eV. The material used as the guard ring may be the same material as the electrode material described above. According to an embodiment of the present invention, the material used in the guard ring is preferably the metal described as the electrode material, because larger flexibility in a design of a withstand-voltage structure can be provided, a large number of guard rings can be provided, and a withstand voltage can be flexibly made improved. A shape of the guard ring is not particularly limited, but may be square-shape, circular, channel-shape, L-shape or band-shape. While a number of the guard rings is not particularly limited, a number of the guard rings may be preferably three or more and more preferably six or more.

(MOSFET)

Figure 20:
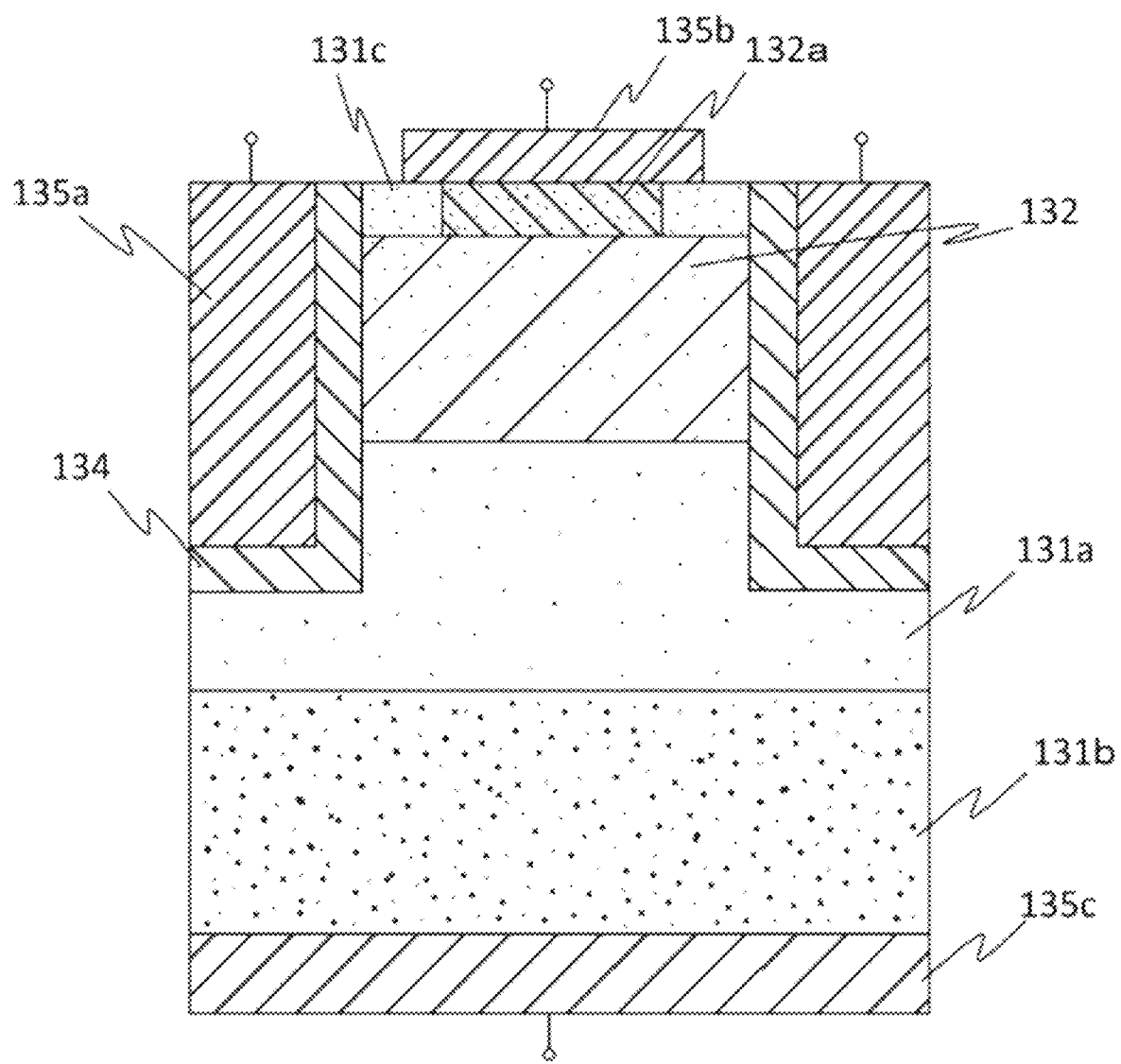
FIG. 20 is a schematic diagram illustrating an embodiment of a Metal Oxide Semiconductor Field Effect Transistor (MOSFET).

FIG. 20 illustrates a metal oxide semiconductor field-effect transistor (MOSFET) according to an embodiment of the present invention including an n-type semiconductor layer 131a, a first n+-type semiconductor layer 131b, a second n+-type semiconductor layer 131c, a p-type semiconductor layer 132, a p+-type semiconductor layer 132a, a gate insulating film 134, a gate electrode 135a, a source electrode 135b and a drain electrode 135c. The p+-type semiconductor layer 132a may be a p-type semiconductor layer, and may be the same as the p-type semiconductor layer 132. A p-type semiconductor of the p-type semiconductor layer may be the same material as an n-type semiconductor of the n-type semiconductor layer. The p-type semiconductor may include a p-type dopant, and may be a different material as the n-type semiconductor.

In addition, the semiconductor device according to a present invention may be used as a power module, an inverter, and/or a converter in combination with a known structure. Also, a semiconductor device according to a present invention may be used in a semiconductor system including a power source, to which the semiconductor device may be electrically connected by a known structure and/or method. The semiconductor device may be electrically connected to a wiring pattern in the semiconductor system.

Figure 3:
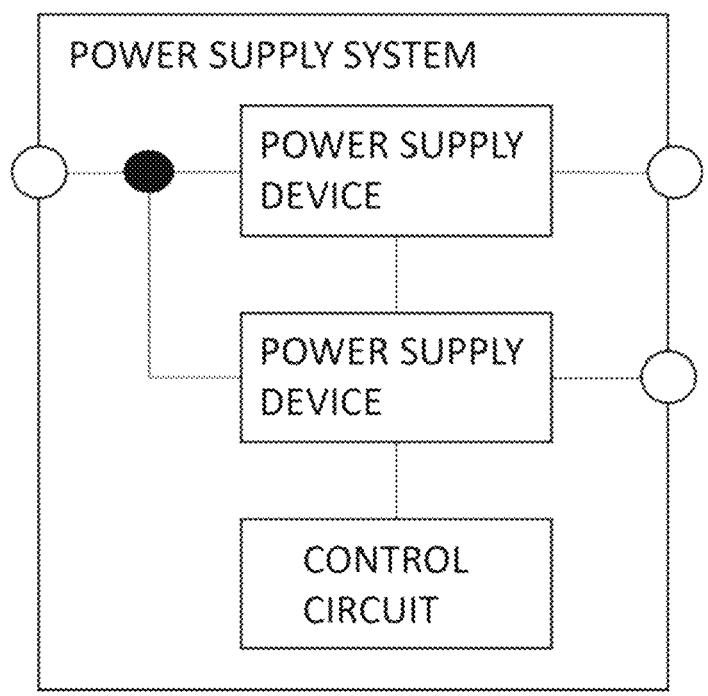
FIG. 3 is a schematic diagram illustrating an embodiment of a power source system.
Figure 4:
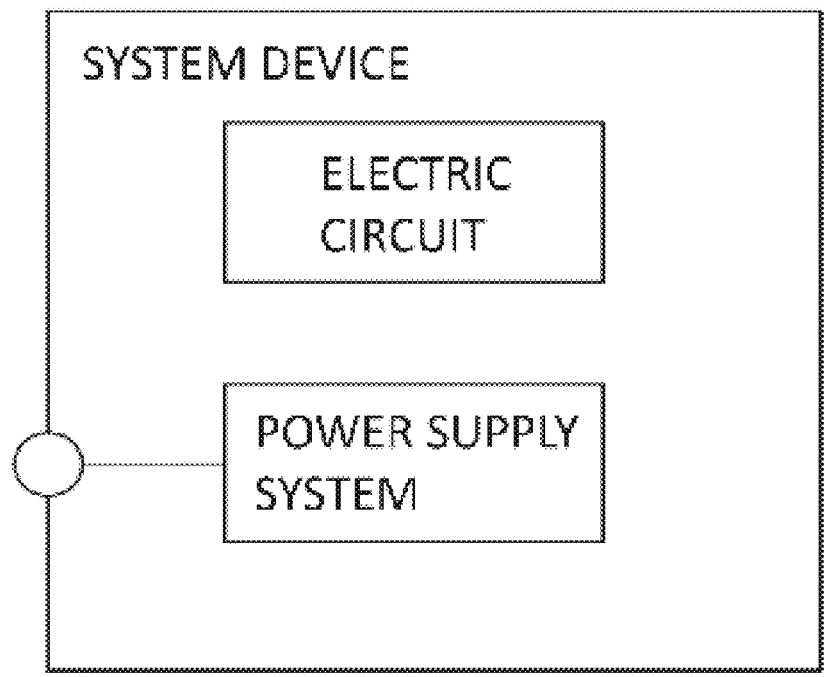
FIG. 4 is a schematic diagram illustrating an embodiment of a system device.
Figure 5:
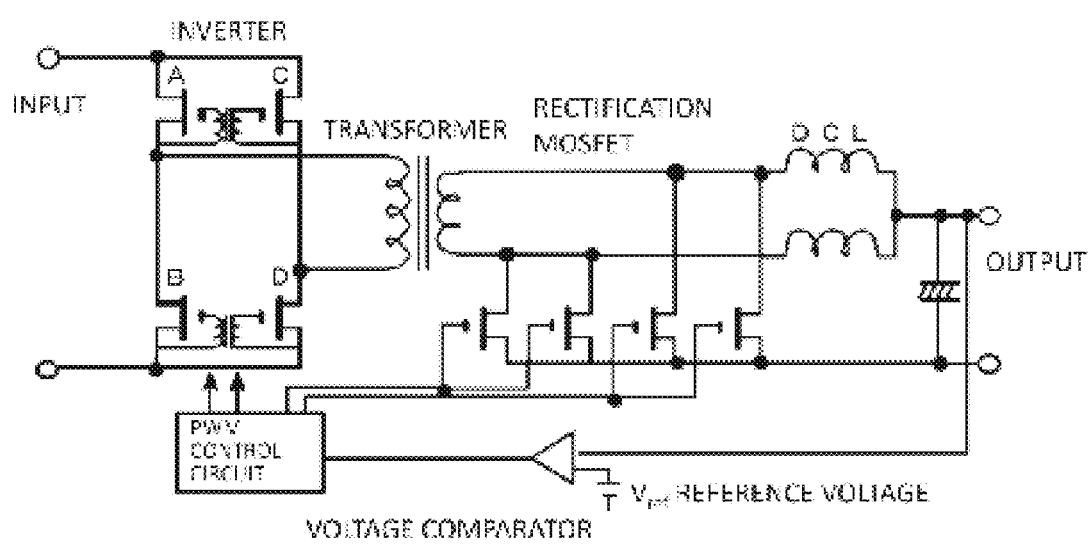
FIG. 5 is a schematic diagram illustrating an embodiment of a circuit diagram of power source device.

FIG. 3 is a schematic view of a circuit diagram illustrating a power source system according to an embodiment of the present invention. FIG. 3 illustrates a schematic view of the power source system using two or more power source devices and a control circuit. The power source system is, as illustrated in FIG. 4, used for a system device in combination with a circuit diagram. Also, FIG. 5 illustrates a power source circuit of a power source device, including a power circuit and a control circuit. A DC voltage is switched at high frequencies by an inverter (configured with MOSFET A to D) to be converted to AC, followed by insulation and transformation by a transformer. The voltage is then rectified by a rectification MOSFET and then smoothed by a DCL (smoothing coils L1 and L2) and a capacitor to output a direct current voltage. At this point, the output voltage is compared with a reference voltage by a voltage comparator to control the inverter and the rectification MOSFETs by a PWM control circuit to have a desired output voltage.

Figure 19:
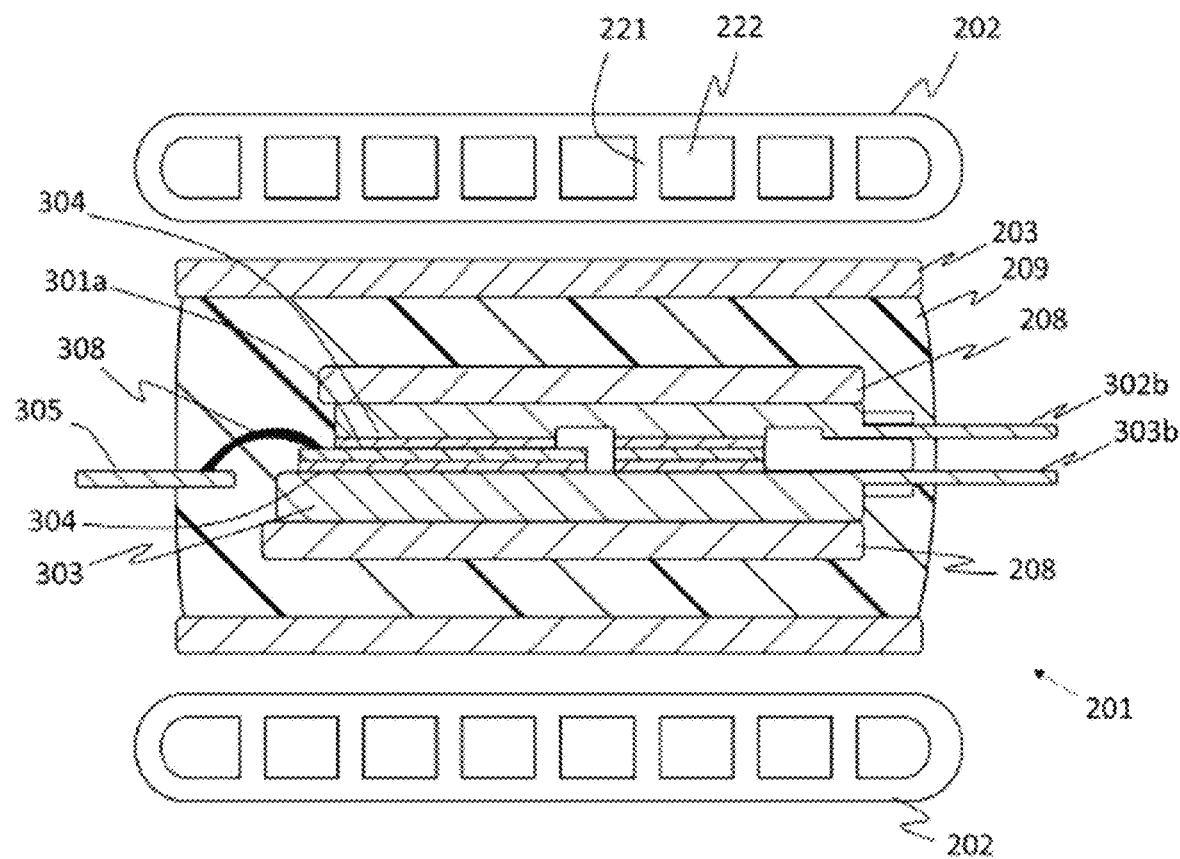
FIG. 19 is a schematic diagram illustrating an embodiment of a power card.

According to an embodiment of the present invention, the semiconductor device is preferably a power card, and is more preferably the power card including a first cooling device provided on a first side of a semiconductor layer including the crystalline oxide semiconductor via a first insulating member and a second cooling device provided on a second side of the semiconductor layer via a second insulating member. Here, the second side of the semiconductor layer is opposite to the first side of the semiconductor layer. Further, it is most preferable that a first heat dissipation layer is provided on the first side of the semiconductor layer and a second heat dissipation layer is provided on the second side of the semiconductor layer. According to the most preferable embodiment the first cooling device is provided on the first heat dissipation layer via the first insulating member and the second cooling device is provided on the second heat dissipation layer via the second insulating member. FIG. 19 illustrates a power card according to an embodiment of the present invention. The power card of FIG. 19 is a double-sided cooled power card 201 including a refrigerant tube 202, a spacer 203, an insulating plate (an insulating spacer) 208, a resin sealing portion 209, a semiconductor chip 301a, a metal heat transfer plate (a protruding terminal portion) 302b, a heat sink and an electrode 303, a metal heat transfer plate (a protruding terminal portion) 303b, a solder layer 304, a control electrode terminal 305, and a bonding wire 308. A refrigerant tube 202 has a number of flow paths 222, in a thickness direction cross section thereof, that are partitioned by a number of partition walls 221 extending in a flow path direction at certain intervals from each other. The power card according to the embodiment of the present invention enables to realize a higher heat dissipation and satisfy a higher reliability.

A semiconductor chip 301a is bonded by a solder layer 304 on an inner main plane of the metal heat transfer plate 302b. The metal heat transfer plate (protruding terminal portion) 302b is bonded by a solder layer 304 on a remaining area of the main plane of the semiconductor chip 301a, so that a surface of an anode electrode and a surface of a cathode electrode of a flywheel diode are connected in so-called antiparallel, to a surface of a collector electrode and a surface of a emitter electrode of IGBT. Examples of material of the metal heat transfer plate (protruding terminal portions) 302b and 303b include Mo and W. The metal heat transfer plate (protruding terminal portions) 302b and 303b have a difference in thickness that absorbs a difference in thicknesses between the semiconductor chip 301a and 301b. This configuration enables an outer surface of the metal heat transfer plate 302 to be planar.

A resin sealing portion 209 is made of, for example, epoxy resin. Side surfaces of the metal heat transfer plate 302b and 303b are covered to be molded with the resin sealing portion 209, and the semiconductor chip 301a is molded with the resin sealing portion 209. However, outer main plane of the heat transfer plates 302b and 303b, that is, contact heat receiving surface of the heat transfer plates 302b and 303b is completely exposed. The metal heat transfer plate (protruding terminal portions) 302b and 303b protrudes to the right from the resin sealing portion 209, as illustrated in FIG. 19. The control electrode terminal 305 that is a lead frame terminal connects, for example, a gate (control) electrode surface of the semiconductor chip 301a on which IGBT is formed and the control electrode terminal 305.

The insulating plate 208 that is an insulating spacer, is made of, for example, an aluminum nitride film, but may be other insulating films. The insulating plate 208 is completely covering the metal heat transfer plates 302b and 303b and is in close contact with the metal heat transfer plates 302b and 303b, however, the insulating plate 208 and the metal heat transfer plates 302b and 303b may be simply in contact. A high heat transfer material such as a silicon grease may be applied between the insulating plate 208 and the metal heat transfer plates 302b and 303b. Also, the insulating plate 208 and the metal heat transfer plates 302b and 303b may be joined by using various methods. Further, an insulating layer may be formed as the insulating plate 208 by using ceramic spraying and the like. The insulating plate 208 may be bonded to the metal heat transfer plate or may be joined or formed on the refrigerant tube.

A refrigerant tube 202 is manufactured by cutting the sheet-shaped aluminum alloy formed by a pultrusion molding method or an extrusion molding method, to a required length. The refrigerant tube 202 has a number of flow paths 222, in thickness direction cross section thereof, that are partitioned by a number of partition walls 221 extending in a flow path direction at certain intervals from each other. A spacer 203 may be, for example, a soft metal plate such as a solder alloy, or may be a film formed by coating and the like on a contact surface of the metal heat transfer plate 302b and 303b. A surface of the soft spacer 3 is easily deformed and conform to a minute irregularities and warpage of the insulating plate 208 and a minute irregularities and warpage of the refrigerant tube 202, so as to reduce a thermal resistance. A known high thermal conductivity grease and the like may be applied on a surface of the spacer 203. Also, the spacer 203 may be omitted.

EXAMPLE 1

1. Deposition Apparatus

In the Example, a deposition apparatus 19 illustrated in FIG. 1 is used.

2. Preparation of a raw material solution

Hydrobromic acid (HBr) was contained at a volume ratio of 20% in a 0.1M aqueous gallium bromide ($GaBr_3$) solution to make a raw material solution.

3. Deposition Preparation

The raw material solution 24a obtained at 2. was set in the mist generator 24. Then, as the substrate 20, a rectangular-shaped (1 mm×2.25 mm) m-plane sapphire substrate in which an a-axis direction is a long side direction, was placed on the hot plate 28, and the hot plate 28 was activated to raise a temperature of the substrate up to 550° C. The flow control valve 23a and 23b were opened to supply a carrier gas from the carrier gas supply device 22a and 22b that are the carrier gas source into the deposition chamber 30 to replace the atmosphere in the deposition chamber 30 with the carrier gas. After the atmosphere in the deposition chamber 30 is sufficiently replaced with the carrier gas, a flow rate of the carrier gas was regulated at 1 L/min. In this embodiment, nitrogen was used as the carrier gas.

4. Deposition

Figure 6:
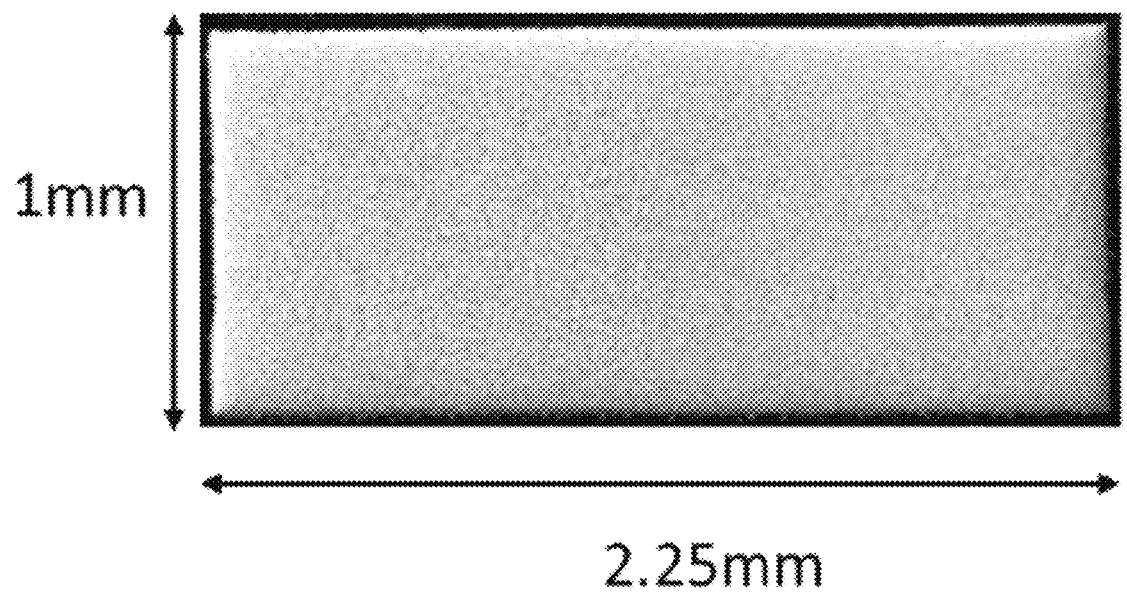
FIG. 6 is a diagram illustrating a microscopic observation result in an example.

The ultrasonic transducer 26 was then vibrated at 2.4 MHz, and the vibration propagated through the water 25a to the raw material solution 24a to atomize the raw material solution 24a to form a mist (atomized droplets) 24b. The mist 24b was introduced in the film deposition chamber 30 by the carrier gas through the supply pipe 27. The mist was thermally reacted at 550° C. under atmospheric pressure to deposit a film on the substrate 20. A deposition time was 2 hours. The obtained film was identified by X-ray diffraction device, and revealed to be $\alpha$-$Ga_2O_3$ single-crystal film. Further, the obtained film was observed by microscope in order to check for cracks. The microscopic image is illustrated in FIG. 6. As apparent from FIG. 6, a crystalline oxide semiconductor with crack-free and an excellent crystal-quality was obtained.

COMPARATIVE EXAMPLE 1

Figure 7:
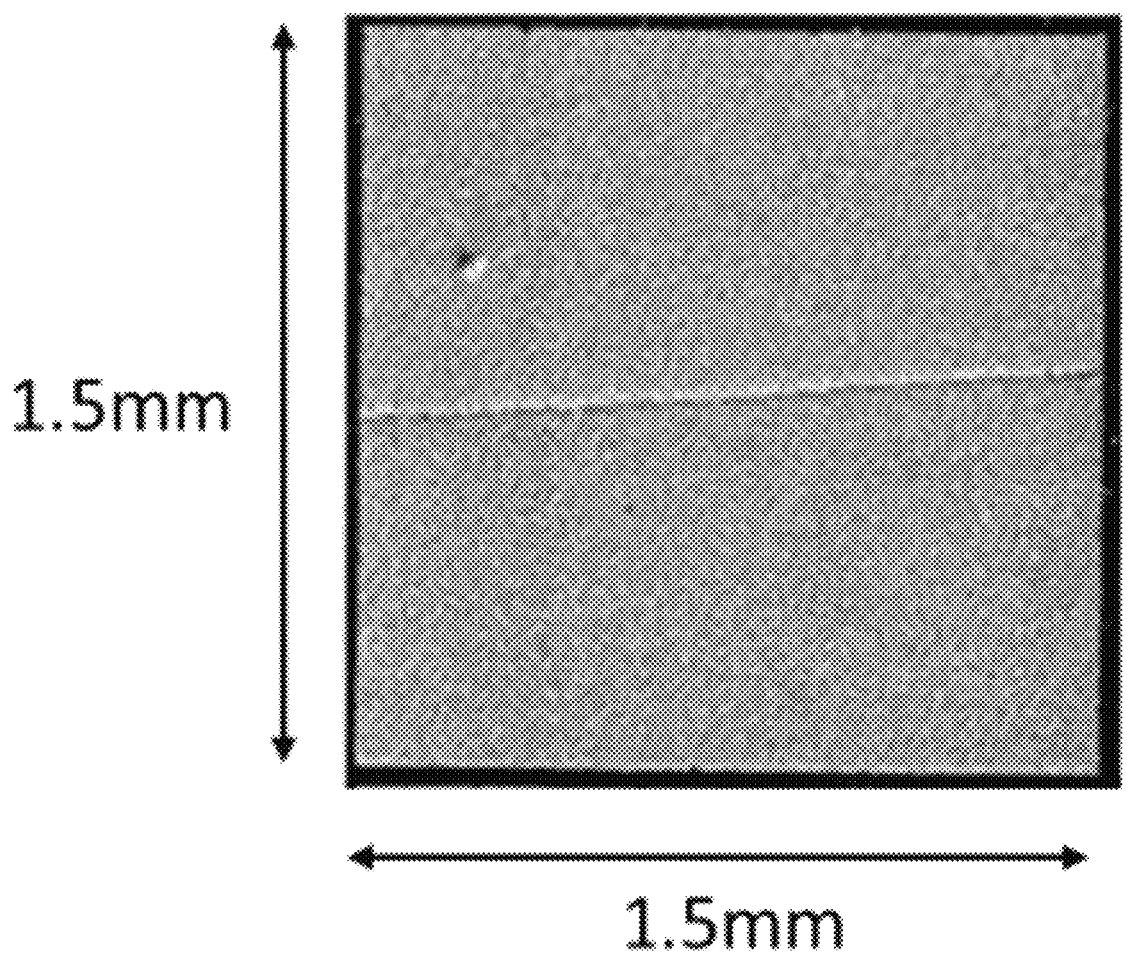
FIG. 7 is a diagram illustrating a microscopic observation result in a comparative example.

A crystalline oxide semiconductor was obtained by a method similarly to the method to obtain the crystalline oxide semiconductor in Example 1 except the following conditions: a square-shaped (1.5 mm×1.5 mm) m-plane sapphire substrate was used as the substrate 20. The obtained crystalline oxide semiconductor was observed by microscope in order to check for cracks. The microscopic image is illustrated in FIG. 7. As apparent from FIG. 7, cracks occurred in places. A crack occurrence rate of the obtained crystalline oxide semiconductor was 5.6%.

(Evaluation)

Figure 8:
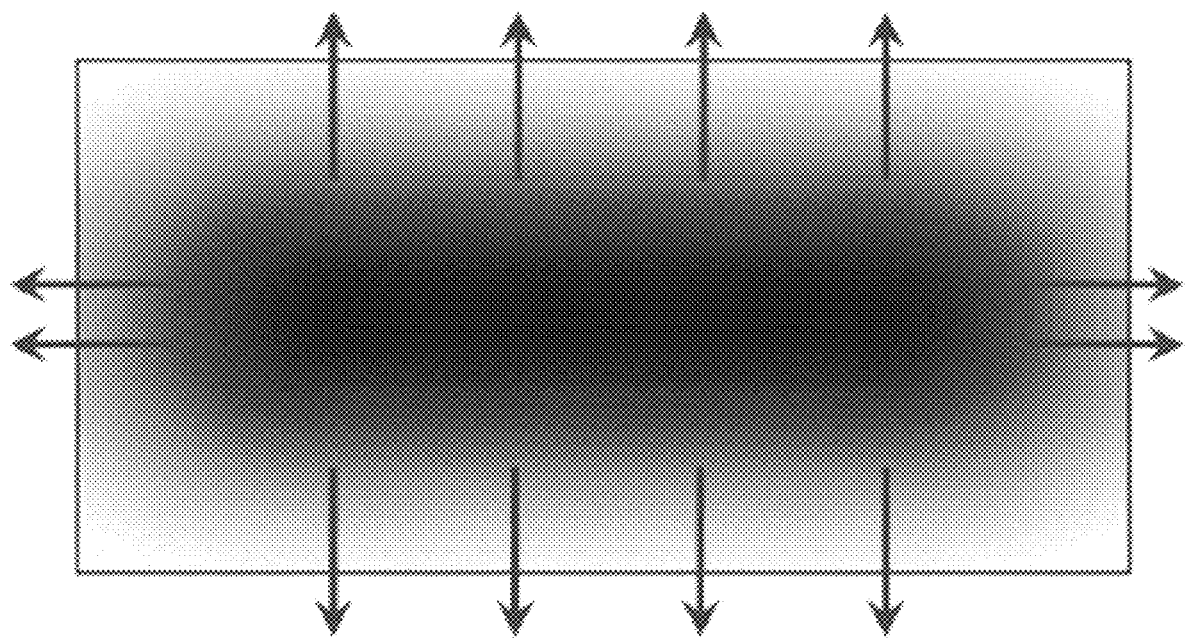
FIG. 8 is a diagram illustrating the results of evaluation of simulating a thermal distribution in a semiconductor device of a crystalline oxide semiconductor obtained in the example. In the diagram, arrows indicate a direction of thermal transfer.
Figure 9:
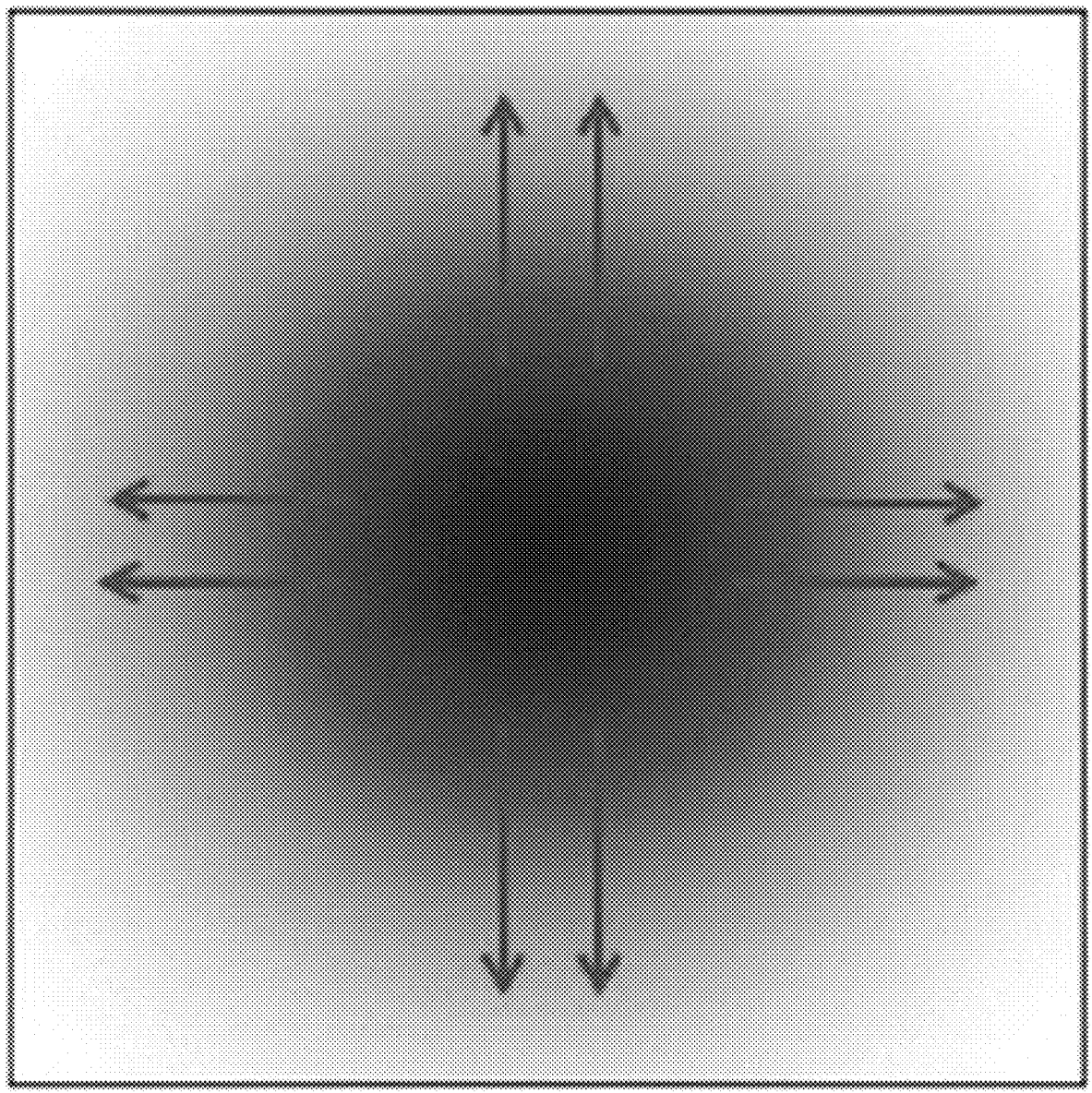
FIG. 9 is a diagram illustrating the results of evaluation of simulating a thermal distribution in a semiconductor device of a crystalline oxide semiconductor obtained in the comparative example. In the diagram, arrows indicate a direction of thermal transfer.

Regarding the thermal dispersion of a product of the example and a product of the comparative example, a simulation was performed respectively when these products were applied to semiconductor devices. The evaluation results of the example product is illustrated in FIG. 8, and the evaluation results of the comparative example product is illustrated in FIG. 9. As apparent from a thermal distribution and the arrows indicating heat transfer directions in FIG. 8 and FIG. 9, the crystalline oxide semiconductor according to the embodiment of the present invention is excellent in thermal dispersion and useful in semiconductor devices requiring heat dissipation.

INDUSTRIAL APPLICABILITY

The crystalline oxide semiconductor according to the present invention can be used in various fields such as semiconductors (for example, compound semiconductor electronic devices), electronic components and electric equipment components, optical and electronic photography-related devices and industrial members, and especially useful for semiconductor devices and members of semiconductor devices.

REFERENCE NUMBER DESCRIPTION 1 barrier height adjustment layer
2 barrier electrode
3 semiconductor region (semiconductor layer)
4 Ohmic electrode
5 guard ring
19 Mist CVD apparatus (deposition apparatus)
20 substrate
21 susceptor
22a carrier gas supply device (a carrier gas source)
22b carrier gas (dilution) supply device (a carrier gas (diluted) source)
23a flow control valve
23b flow control valve
24 mist generator
24a raw material solution
25 container
25a water
26 ultrasonic transducer
27 supply pipe tube
28 hot plate (heater)
29 air outlet
30 deposition chamber
101a n--type semiconductor layer
101b n+-type semiconductor layer
102 p-type semiconductor layer
103 semi-insulating layer
104 insulator layer
105a Schottky electrode
105b Ohmic electrode
121a n-type semiconductor layer with wide band gap
121b n-type semiconductor layer with narrow band gap
121c n+-type semiconductor layer
123 p-type semiconductor layer
124 semi-insulating layer
125a gate electrode
125b source electrode
125c drain electrode
128 buffer layer
131a n--type semiconductor layer
131b first n+-type semiconductor layer
131c second n+-type semiconductor layer
132 p-type semiconductor layer
132a p+-type semiconductor layer
134 gate insulating film
135a gate electrode
135b source electrode
135c drain electrode
141a n--type semiconductor layer
141b first n+-type semiconductor layer
141c second n+-type semiconductor layer
145a gate electrode
145b source electrode
145c drain electrode
151 n-type semiconductor layer
151a n--type semiconductor layer
151b n+-type semiconductor layer
152 p-type semiconductor layer
154 gate insulating film
155a gate electrode
155b emitter electrode
155c collector electrode
161 n-type semiconductor layer
162 p-type semiconductor layer
163 light emitting layer
165a first electrode
165b second electrode
167 transmitting electrode
169 substrate
201 double-sided cooled power card
202 refrigerant tube
203 spacer
208 insulating plate (an insulating spacer)
209 resin sealing portion
221 partition wall
222 flow path
301a semiconductor chip
302b metal heat transfer plate (a protruding terminal portion)
303 heat sink and an electrode
303b metal heat transfer plate (a protruding terminal portion)
304 solder layer 305 control electrode terminal
308 bonding wire

What is claimed is:

1. A crystalline oxide semiconductor comprising:
   a first crystal axis;
   a second crystal axis;
   a first side;
   a second side that is shorter than the first side;
   a linear thermal expansion coefficient of the first crystal axis;
   a linear thermal expansion coefficient of the second crystal axis that is larger than the linear thermal expansion coefficient of the first crystal axis;
   a direction of the first side;
   a direction of the first crystal axis that is parallel or substantially parallel to the direction of the first side;
   a direction of the second side; and
   a direction of the second crystal axis that is parallel or substantially parallel to the direction of the second side.

2. The crystalline oxide semiconductor of claim 1,
   wherein the crystalline oxide semiconductor includes, as a major component, a metal oxide including gallium.

3. The crystalline oxide semiconductor of claim 1,
   wherein the crystalline oxide semiconductor includes, as a major component, a metal oxide including a corundum structure.

4. The crystalline oxide semiconductor of claim 3,
   wherein the metal oxide includes at least one metal selected from gallium, indium, rhodium and iridium.

5. The crystalline oxide semiconductor of claim 3,
   wherein the metal oxide includes gallium, and indium and/or aluminum.

6. The crystalline oxide semiconductor of claim 1,
   wherein each of the first side and the second side is represented by a straight line.

7. The crystalline oxide semiconductor of claim 1,
   wherein the crystalline oxide semiconductor is in the shape of a film.

8. The crystalline oxide semiconductor of claim 7,
   wherein the crystalline oxide semiconductor includes a corundum structure, and
   a principal plane of the crystalline oxide semiconductor is an a-plane, an m-plane or an r-plane.

9. The crystalline oxide semiconductor of claim 7,
   wherein the crystalline oxide semiconductor includes a corundum structure,
   a principal plane of the crystalline oxide semiconductor is a c-plane, and
   the crystalline oxide semiconductor has an off angle that is 0.2° or more.

10. A semiconductor device comprising:
    a semiconductor layer including the crystalline oxide semiconductor of claim 1; and
    an electrode.

11. The semiconductor device of claim 10,
    wherein the semiconductor device is a power device.

12. The semiconductor device of claim 10,
    wherein the semiconductor device is a power module, an inverter or a converter.

13. The semiconductor device of claim 10,
    wherein the semiconductor device is a power card.

14. The semiconductor device of claim 13,
    wherein the semiconductor device includes a first cooling device and a second cooling device, and
    wherein the first cooling device is provided on a first side of the semiconductor layer via a first insulating member, and the second cooling device is provided on a second side of the semiconductor layer via a second insulating member, and
    wherein the second side of the semiconductor layer is opposite to the first side of the semiconductor layer.

15. The semiconductor device of claim 14, further comprising
    a first heat dissipation layer that is provided on the first side of the semiconductor layer and a second heat dissipation layer that is provided on the second side of the semiconductor layer, and wherein the first cooling device is provided on the first heat dissipation layer via the first insulating member, and the second cooling device is provided on the second heat dissipation layer via the second insulating member.

16. A semiconductor system comprising:
    the semiconductor device of claim 10.

* * * * *